United States Patent [19]

Oishi et al.

[11] Patent Number: 5,792,814
[45] Date of Patent: Aug. 11, 1998

US005792814A

[54] METHOD FOR PREPARING MODIFIED RESINS AND THEIR APPLICATIONS

[75] Inventors: Tetsuya Oishi; Kazuo Sugazaki, both of Kanagawa-ken; Jin Suzuki, Tokyo, all of Japan

[73] Assignee: Mitsui Chemicals, Inc., Tokyo, Japan

[21] Appl. No.: 906,316

[22] Filed: Aug. 5, 1997

Related U.S. Application Data

[62] Division of Ser. No. 514,730, Aug. 14, 1995, Pat. No. 5,674,947.

[30] Foreign Application Priority Data

Aug. 16, 1994 [JP] Japan ................... 6-192578

[51] Int. Cl.$^6$ ........................... C08L 63/00
[52] U.S. Cl. ........................ 525/119; 525/120; 525/122; 525/403; 525/408
[58] Field of Search .................. 525/112, 119, 525/120, 122, 403, 408

[56] References Cited

U.S. PATENT DOCUMENTS

| | | | |
|---|---|---|---|
| 3,214,416 | 10/1965 | Waack | 525/285 |
| 3,522,204 | 7/1970 | Savides | 524/285 |
| 3,773,718 | 11/1973 | Klebe et al. | 525/375 |
| 3,928,507 | 12/1975 | Boyer | 524/139 |
| 4,005,156 | 1/1977 | Schmerling | 525/287 |
| 4,039,491 | 8/1977 | Ikeda et al. | 525/289 |
| 4,198,493 | 4/1980 | Marciandi | 524/100 |
| 4,933,425 | 6/1990 | Gallucci | 525/464 |
| 5,354,814 | 10/1994 | Besecke et al. | 525/379 |

FOREIGN PATENT DOCUMENTS

| | | |
|---|---|---|
| 0577002 | 6/1993 | European Pat. Off. |
| 2022097 | 7/1970 | France |
| 2403357 | 9/1978 | France |

*Primary Examiner*—Peter A. Szekely
*Attorney, Agent, or Firm*—Burns, Doane, Swecker & Mathis, L.L.P.

[57] ABSTRACT

There are herein disclosed a method for preparing a modified resin which comprises thermal/reaction by the use of a norbornenyl group-containing compound typified by norbornenecarboguanamine or its derivative, a method for preparing an epoxy-modified resin which comprises the step of reacting the above-mentioned modified resin and an epoxide, a flame-retarding method, a thermal stabilization method, a compatibilizing method and a surface modification method which comprise utilizing the modified resin, as well as a coating resin composition and an adhesive resin composition containing the modified resin.

According to the preparation methods of the present invention, the deterioration of a material scarcely occurs, and a functional group which is excellent in flame retardancy, thermal stability, compatibility and the like can be introduced to the resins. By the utilization of these techniques, there can be obtained a flame-retardant material having a good char formability, a thermally stable material whose molded articles can inhibit heat deterioration, a material excellent in miscibility between different kinds of resins, a surface-modified material which is excellent in adhesion and coating properties and the like.

3 Claims, No Drawings

METHOD FOR PREPARING MODIFIED RESINS AND THEIR APPLICATIONS

This application is a divisional of application Ser. No. 08/514,730, filed Aug. 14, 1995, now U.S. Pat. No. 5,674,947.

BACKGROUND OF THE INVENTION

1. Field of the Invention

The present invention relates to the modification of resins such as usual resins, rubbers, waxes and oils. More specifically, it relates to methods useful to modify such resins, thereby improving properties such as flame retardancy, thermal stability, compatibility, surface properties such as adhesive properties, coating properties and dyeability as well as electrical properties of the resins, and it also relates to the applications of the modified resins.

2. Description of the Related Art

In general, resins are excellent in electrical properties, mechanical properties and workability, and so they have widely been used in many industrial fields as construction materials, electrical materials, vehicle, e.g., automotive materials, fiber materials, equipment materials and utensil materials.

However, these resins are extremely easily flammable, and keeping step with their extensive use, they have often become a predominant fire cause and a fuel source in the fire. Thus, the safety of the resins as the industrial materials has been strongly demanded. In addition, these resins are accompanied by some drawbacks. For example, the performance of flame retardancy, heat resistance and the like is poor; thermal stability is so practically insufficient as to easily deteriorate by heat, light and the like; and surface properties such as wettability, adhesive properties, coating properties and dyeability are poor, so that the applications of these resins are noticeably limited.

Furthermore, with the diversification of the applications of the resins, very high performances and characteristics have been required. However, in order to develop novel kinds of resins and to solve the respective problems in reply to this requirement, some technical and economical hurdles must be cleared. It has now been desired to improve and impart the performances of the resins without impairing their original characteristics, and so the development of new materials by the modification and combination of the resins is the extremely important theme in the industrial field.

A. Heretofore, as methods for improving and imparting the characteristics of a resin, there are known, for example, a method for providing a new kind of resin by the use of a new raw material, a novel synthesis technique, a novel polymerization technique and the like, and a method for modifying the resin with an already developed resin to improve and impart the various performances.

In the former method, it is practically difficult or technically very hard to create the new kind of resin which can meet the above-mentioned requirements, and another economical problem is also present.

On the other hand, the latter method has conveniences that the resin is easily available and the characteristics of the resin are already grasped, and the modification method, which comprises, for example, the introduction reaction of a functional group to the resin, is excellent in economical and technical points, and many suggestions regarding such modification methods have been made.

As one of the known modification methods, there is known a technique which comprises carrying out a modification reaction by the use of a reactant having the functional group, but for example, such a functional group is bonded only to a terminal position having a specific structure of the resin, or the amount of the functional group is noticeably limited. For these reasons, the accomplishment of the sufficient modification is difficult, and the modification or denaturation of the resin by the-use of such a functional group is also hard. In a certain case, these modification methods are scarcely useful.

Furthermore, there is also known another modification method which comprises introducing the functional group to a resin such as a polyolefin resin having no functional group by the use of a reactant such as maleic anhydride or acrylic acid and a peroxide such as benzoyl peroxide together, and then carrying out a denaturation reaction using this functional group to modify the resin. This modification method has advantages that the functional group such as a carboxylic acid (anhydride) group which can easily be used for the modification or the secondary denaturation of the modification can be introduced and a preparation process is relatively easy, but this method is simultaneously accompanied by some disadvantages. For example, since the employment of the peroxide is required, the decomposition of the resin and the like occurs to noticeably lower the molecular weight, of the resin and to bring about the coloring and quality change of the resin; it is difficult to introduce a large amount of the functional group, so that the modification of the resin is insufficient; thermal stability, heat resistance and the like deteriorate, and the functional group is separated off to noticeably accelerate the decomposition of the resin; and the polymerization and the like of the used reactant itself occurs to easily form reaction products, so that the physical properties of the resin easily deteriorate inconveniently.

Moreover, in this modification method, it is very difficult to introduce the functional group which is effective for the modification, performance impartment and the like, and thus a manner of adding a modifier having such a functional group can also be used. However, the employment of such a modifier inconveniently gives rise to the deterioration of the physical properties and characteristics of the resin.

The above-mentioned known modification methods are still impractical, and they are noticeably limited for technical and economical reasons.

The present inventors have intensively investigated with the intention of overcoming the above-mentioned drawbacks of the modification methods for resins, and as a result, it has been found that by reacting a resin with a compound quite different from compounds used in the known methods in structure and characteristics under specific reaction conditions, the resin can be successfully modified. According to this modification method, even if a large amount of the functional group is introduced to the resin, the molecular weight, physical properties and quality of the modified resin scarcely deteriorate; the amount of the functional group to be introduced can be selected in a wide range, and so the modification and performance impartment can easily be controlled; the use of a peroxide is not required, and hence the conditions of a modification reaction are moderate, a process is easy to conduct, and side reactions can be inhibited to prevent the decomposition and thus the quality change of the resin; since the functional group having an excellent modification and performance impartment power can be introduced and bonded to the resin without adding and mixing the compound having such a functional group, the physical properties of the resin are not impaired; even for the resin not having a functional group such as a carboxylic acid group, an amino group or a double bond group, the modification and performance impartment can be accomplished by the introduction of the functional group; the functional group which scarcely brings about the deterioration by heat or the like and which is capable of remarkably improving heat resistance can be introduced and bonded to the resin; and the functional group for improving properties such as flame retardancy, compatibility, surface properties such as wettability, adhesive properties, coating properties and dyeability, electrical properties, moldability and the like can be introduced and bonded to the resin to accomplish the modification and performance impartment. In consequence, a method for preparing the modified resin having the above-mentioned features can be provided.

In addition, it has also be found that when the modified resin obtained by the above-mentioned method is reacted with an epoxide under specific reaction conditions, an epoxy-modified resin can be obtained which is more excellent in surface properties such as wettability, coating properties, adhesive properties, dyeability and chemical resistance, electrical properties, moldability, compatibility and dispersibility with an other resin in addition to above-mentioned good features and which can be widely used for various modifications. In consequence, a method for preparing the epoxy-modified resin can be provided. On the basis of the findings of these preparation methods, the present invention has now been attained.

B. For the purpose of improving the flame retardancy of a resin, various methods have been suggested. For example, there have been suggested a method which comprises adding a flame-retardant to the resin, and a method which comprises using a flame retardancy-imparting material (inclusive of a halogen monomer) at the manufacture of the resin to incorporate the flame retardancy into the skeleton of the resin.

Among these techniques, the former method which comprises adding the flame-retardant to the resin has usually often been used, and examples of the known flame-retardant include halogen-containing compounds, phosphorus-containing compounds, inorganic compounds, nitrogen-containing compounds and the like.

When the halogen-containing compound is used as the known flame-retardant, the modified resin has some drawbacks. For example, heat resistance is usually poor; sublimation and bleeding tend to occur; an effect cannot be obtained in most cases, unless antimony trioxide is used together; and a large amount of an extremely toxic halogen-containing gas is generated in a fire. When the phosphorus-containing compound is used as the flame-retardant, the effect is insufficient if the compound is used singly, and the halogen-containing compound is often used together, so that the modified resins have the above-mentioned drawbacks. When the inorganic compound is used, the modified resin has some disadvantages. For example, an inorganic compound such as antimony trioxide is a rare substance of resources, and hence it is not easily available and there is also the problem of cost; in the case of aluminum hydroxide, the effect is weak and so it is necessary to add the same in large quantities; the specific gravity of the modified resin increases, the physical properties and moldability of the resin tend to deteriorate and the heat resistance of the resin deteriorates owing to contained water component. In addition, when the nitrogen-containing compound, typified by triazine nucleus-containing compound is used, the modified resin has-the following disadvantages. For example, sublimation, bleeding and the like tend to occur at molding; the manufacturing of the raw material is difficult, and the material cost is high; the physical properties and characteristics of the resin are liable to deteriorate owing to the added additive; the additive is lost with time, and the dispersability and miscibility of the additive also lowers, so that a flame-retardant effect noticeably decreases; and since a large amount of the additive is required to be added, the characteristics and physical properties of the resin are outstandingly impaired.

As the latter method, there is known a technique in which a material containing bromine, phosphorus or the like is incorporated as the flame retardancy-imparting material into the resin at the time of manufacturing. In this case, the loss, insufficient dispersion and the like of an effective flame-retardant component can be prevented, so that the reduction of the effect can be minimized, with the result that the physical properties, characteristics and the like of the resin can be easily advantageously maintained. However, this method has some inconveniences. For example, it is difficult to manufacture the flame retardancy-imparting material; a material cost is high; the acquisition of the flame retardancy-imparting material suitable for the manufacture of the resin is noticeably limited and can technically scarcely be obtained; it is very difficult or quite impossible to introduce and bond the flame retardancy-imparting material to the resin owing to the restriction on the manufacture of the resin, so that the desired resin can scarcely be provided; since the thermal stability of the flame retardancy-imparting material is poor, the thermal stability, heat resistance and the like of the obtained resin are poor; and a large amount of a toxic gas is generated in a fire.

These known flame-retarding methods for the resins are still insufficient and impractical, and they are noticeably limited for technical and economical reasons.

The present inventors have intensively investigated to overcome the above-mentioned drawbacks of the flame-retarding methods for resins, and as a result, it has been found that by using the modified resin or the epoxy-modified resin obtained by the above-mentioned method (A), the flame retardancy can be successfully imparted to the resin. According to this flame-retarding method of the resin, the modified resin is used in which a flame retardancy-imparting component is introduced and bonded to the resin, and therefore the dispersion and miscibility of the component can be achieved without any failure, whereby the flame retardancy of the resin can be remarkably improved; sublimation, bleeding and the like do not-appear in contrast to the method which comprises adding a flame-retardant such as melamine; the production of char is extremely good, so that the sagging or dripping of oil droplets or a melt can be sufficiently inhibited; a toxic gas is scarcely generated; the excellent characteristics and physical properties of the resin are not impaired; even to the resin to which the flame retardancy-imparting component is scarcely introduced and bonded in a manufacturing process, the functional group regarding the flame retardancy-imparting component can be easily introduced and bonded; such a functional group can be introduced after the manufacture of the resin, and so the resin can be easily manufactured at a low cost. In consequence, an excellent flame-retarding method of a resin can be provided. In addition, it has also been found that when the above-mentioned modified resin is used together with phosphoruses, an isocyanuric acid, a cyanuric acid or an amino group-containing compound, the resin having the further improved flame retardancy can be successfully obtained. In consequence, a more excellent flame-retarding method of a resin can be provided. On the basis of these findings, the present invention has now been attained.

C. Usually, resins tend to become brittle, or are liable to bring about decomposition or coloring owing to the application of external energy such as heat or light, or owing to the presence of oxygen or a heavy metal. Thus, the long-term heat resistance and weathering resistance of the resins are poor, and stability at heating is bad, so that moldability is largely limited. Therefore, in order to improve moldability and workability, it is necessary to blend the resin with another resin, and this blending results in the deterioration of the characteristics and physical properties of the resin. For this reason, the blending method is limited, though the resin has the excellent characteristics. Heretofore, various techniques for improving the blending method have been suggested, but they are still insufficient to overcome the above-mentioned faults. In an extreme case, even the excellent characteristics of the resin are lost, and some of the suggested techniques cannot be utilized at all.

As an example of conventional thermal stabilization methods, there has been suggested a thermal stabilization method of a resin composition which comprises adding, to the resin composition, a thermal stabilizer such as a benzoate, an amine, an arylphosphondiamide, an organic phosphite, a hindered phenol, melamine, benzoguanamine, phthaloguanamine or spiroquanamine (e.g. Japanese Patent Publication No. 47739/1976).

However, the resins obtained by this thermal stabilization methods have the following drawbacks. That is to say, ultraviolet light resistance and weathering resistance are poor, and color change also noticeably occurs; when molding is carried out at a high temperature, coloring, the color change and the like also noticeably occur; a thermal stabilization effect is still insufficient; the thermal stabilizer itself easily gives rise to thermal decomposition at the time of the working and the thermal stabilization effect is very low, and for the resin which will be subjected to the high-temperature molding, any effect cannot be exerted; and the effect of the thermal stabilizer is very low owing to dispersion failures such as the loss and bleeding of the added and mixed thermal stabilizer with time, and in an extreme case, the effect is all lost. In consequence, this thermal stabilization method of the resin is still insufficient and impractical, and its utilization is noticeably limited for technical and economical reasons.

In view of the above-mentioned defects of the thermal stabilization method of the resins, the present inventors have intensively investigated. As a result, it has been found that by using the modified resin or the epoxy-modified resin obtained by bonding and introducing the specific functional group in accordance with the above-mentioned preparation method (A), the resin can be successfully thermally stabilized. According to this thermal stabilization method of the resin, ultraviolet light resistance, weathering resistance, thermal stabilization and heat resistance can be noticeably improved; since a thermal stabilization-imparting component is bonded and introduced to the resin, the dispersion and miscibility of the component can be achieved without any failure, and so the effect of the stabilization is very high; the deterioration of the resin can be inhibited even when the resin is used at a relatively high temperature for a long period of time, and the resin itself is difficult to decompose even at the high temperature, so that the long-term heat resistance is excellent; since the thermal stabilization-imparting component is scarcely lost, so that the thermal stabilization effect scarcely deteriorates, and the handling properties, physical properties and characteristics of the resin can be sufficiently maintained; the decomposition and deterioration of the resin by ions of a heavy metal such as copper can be remarkably inhibited; even when molding or working is carried out at a high temperature, the heat deterioration, coloring and color change of the resin can be inhibited; and temperature for 5% weight reduction of the resin at heating can be remarkably improved, so that the thermal stability and heat resistance of the resin can be sufficiently enhanced and the high-temperature molding or working is extremely easy, and for example, for polyphenyleneether resins and the like in which the high-temperature moldability or workability is noticeably limited by a conventional technique, a moldability improver or the like is unnecessary, with the result that a new material having excellent physical properties and characteristics can be provided at a low cost. In consequence, an excellent thermal stabilization method of the resins can be provided. On the basis of the finding of this stabilization method of the resins, the present invention has now been attained.

D. Usually, resins possess excellent characteristics and have been widely used in many industrial fields, but as resin modification techniques for improving various performances and imparting a new performance without impairing the characteristics of the resin, various polymer alloy formation methods have been suggested.

Heretofore, as the polymer alloy formation method of a resin, there have been suggested a method which comprises modifying the resin itself to impart the performance to the resin, and a method which comprises adding a third component such as a compatibilizer to the resin.

The former method is useful which permits the easy formation of the modified resin having not only excellent compatibility and solubility but also the uniform performance. However, this method has some drawbacks. For example, the modification reaction of the resin is difficult to carry out, and the characteristics of the modified resin tend to deteriorate because of the molecular weight reduction, coloring and color change of the resin at the modification. On the other hand, the latter method has the following disadvantages. That is to say, the heat resistance, weathering resistance, water resistance and characteristics of the obtained resin deteriorate owing to the presence of the contained third component; the manufacturing process of the compatibilizer is complex, and a manufacturing cost of the compatibilizer is high; it is difficult to obtain the resin having the uniform performance, because of the dispersion failure of the third component; and it is also difficult to obtain the resin having improved physical properties and characteristics.

The present inventors have intensively investigated to overcome the above-mentioned defects of the compatibilization method of a resin, and as a result, it has been found that by using the aforesaid modified resin or epoxy-modified resin obtained by the above-mentioned method (A), different kinds of resins; can be successfully compatibilized. According to this compatibilization method of resins, the compatibilization between different kinds of resins and the solubility of the resins are excellent; the heat resistance, weathering resistance, water resistance, chemical resistance and the like of the obtained resin are also excellent; and the resin can easily be manufactured at a low cost. In consequence, an excellent compatibilization method of resins can be provided. On the basis of this knowledge, the present invention has now been attained.

E. Usually, resins are excellent in characteristics such as electrical properties, mechanical properties and moldability, and so they have been widely used in many industrial fields, but with the diversification and enhancement of their applications, it has been strongly desired to improve the characteristics of resins by combination with a different kind of material. It has been an industrially important theme to improve surface properties such as the coating properties on the surface of the resin, the adhesive properties of the resin to another kind of material, wettability, dyeability, water/oil repellency and solvent resistance, and electrical properties such as chargeability and conductivity, and it has been another theme to develop a coating resin composition and an adhesive resin composition useful for such materials.

Heretofore, as methods for modifying the surface of the resin, there has been suggested a surface modification method utilizing an oxidizing agent and corona discharge, and another surface modification method which comprises adding an additive to the resin. In the former method, since a surface treatment is carried out after the molding or the like, a treatment procedure is noticeably troublesome; it is difficult to do the surface treatment on molded articles having various shapes; and a modification effect is not practically sufficient. In the latter method, since the additive is lost with time, the effect of the additive noticeably lowers in a short term; and the compatibility of the resin with the additive as well as the solubility of the additive in the resin is poor, so that the sufficient surface modification effect cannot be obtained. These surface modification methods of the resin are still practically insufficient, and the utilization of these methods is noticeably limited for technical and economical reasons.

The present inventors have intensively investigated with the intention of overcoming the above-mentioned defects of the surface modification methods of a resin, and as a result, it has been found that by using the modified resin or the epoxy-modified resin obtained by the above-mentioned method (A), the surface of the resin can be successfully modified. According to this surface modification method of a resin, surface properties such as wettability, coating properties, adhesive properties, dyeability, water/oil repellency, and electrical properties such as chargeability and conductivity of the resin can be remarkably improved; since the resin itself can be modified, so that the modified resin is excellent in high-temperature stability and non-volatility, and the diminution of the effect due to the loss of a surface-modifying component does not take place; the surface modification can be uniformly achieved on molded articles having various shapes; and there can be sufficiently modified a polyolefin resin such as a polypropylene resin and a polyolefin fiber in which surface properties such as adhesive properties, coating properties and dyeability are noticeably limited. In consequence, an excellent surface modification method of a resin can be provided. In addition, it has also been found that a coating resin composition and an adhesive resin composition can be provide which are extremely useful for resins and which comprises the above-mentioned modified resin or epoxy-modified resin. On the basis of these findings, the present invention has now been attained.

OBJECT AND SUMMARY OF THE INVENTION

According to the present invention, there can be provided:

(a) A method for preparing a modified resin which comprises the step of reacting, in a temperature range of from 200° to 450° C., a resin with at least one selected from the group consisting of compounds each having at least one norbornenyl group represented by the formula (1)

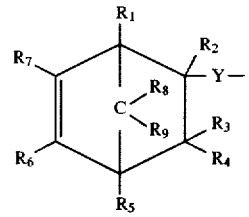

wherein $R_1$, $R_2$, $R_3$, $R_4$, $R_5$, $R_6$, $R_7$, $R_8$ and $R_9$ each is a hydrogen atom, an alkyl group having 1 to 4 carbon atoms or a phenyl group, and they may be the same or different; and Y is a group selected from the group consisting of a triazinyl group which may have a substituent, an amido group, a carboxylate group, an oxazolinyl group, an oxycarbonyl group, an urethane group, a cyanuric acid ester group, an ether group, a carbamoyl group and a carbonyl group.

(b) The method for preparing a modified resin according to the above-mentioned paragraph (a) wherein the compound having the norbornenyl group of the formula (1) is a compound represented by the formula (2)

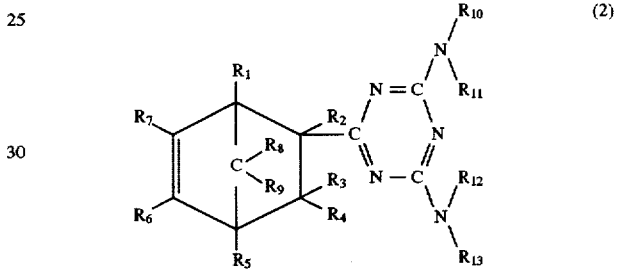

wherein $R_1$, $R_2$, $R_3$, $R_4$, $R_5$, $R_6$, $R_7$, $R_8$ and $R_9$ have the same meanings as defined in the formula (1); $R_{10}$, $R_{11}$, $R_{12}$ and $R_{13}$ each is a hydrogen atom or a group having one or more carbon atoms, and they may be the same or different.

(c) The method for preparing a modified resin according to the above-mentioned paragraph (a) wherein the compound having the norbornenyl group of the formula (1) is a condensate having an average addition condensation degree more than 1 which is obtained by subjecting a compound represented by the formula (2) in which at least one of $R_{10}$, $R_{11}$, $R_{12}$ and $R_{13}$ is a hydrogen atom, a co-condensable compound as an optional reactant and an aldehyde to addition condensation reaction.

(d) The method for preparing a modified resin according to the above-mentioned paragraph (a) wherein the compound having the norbornenyl group of the formula (1) is an etherified condensate having an average addition condensation degree more than 1 which is obtained by subjecting a compound represented by the formula (2) in which at least one of $R_{10}$, $R_{11}$, $R_{12}$ and $R_{13}$ is a hydrogen atom, a co-condensable compound as an optional reactant and an aldehyde to addition reaction or addition condensation reaction, and then subjecting the reaction product and at least one alcohol selected from alcohols having 1–20 carbon atoms to etherification and optionally to simultaneous condensation.

(e) The method for preparing a modified resin according to the above-mentioned paragraph (a) wherein the compound having the norbornenyl group of the formula (1) in which Y is an amido group is at least one selected from the group consisting of reaction products of amines having one or more carbon atoms and 5-norbornene-2-carbonyl halides.

(f) The method for preparing a modified resin according to the above-mentioned paragraph (a) wherein the compound having the norbornenyl group of the formula (1) in which Y is a carboxylate group is at least one selected from the group consisting of reaction products of alcohols having four or more carbon atoms and 5-norbornene-2-carbonyl halides.

(g) The method for preparing a modified resin according to the above-mentioned paragraph (a) wherein the compound having the norbornenyl group of the formula (1) in which Y is an oxazolinyl group is :2-(bicyclo[2.2.1]hept-5-en-2-yl)-2-oxazoline.

(h) The method for preparing a modified resin according to the above-mentioned paragraph (a) wherein the compound having the norbornenyl group of the formula (1) in which Y is an amido group is at least one selected from the group consisting of reaction products of a carboxylic acid having one or more carbon atoms and 2-(bicyclo[2.2.1]hept-5-en-2-yl)-2-oxazoline.

(i) A method for preparing an epoxy-modified resin which comprises the step of reacting the modified resin described in any one of the above-mentioned paragraphs (b) to (d) with at least one selected from the group consisting of epoxides.

(j) A flame-retarding method of a resin which comprises the step of using at least one resin selected from the group consisting of the modified resins described in the above-mentioned paragraphs (b) to (d) and the epoxy-modified resin described in the above-mentioned paragraph (i).

(k) A thermal stabilization method of a resin which comprises the step of using at least one refin selected from the group consisting of the modified resins described in the above-mentioned paragraphs (b) to (d) and the epoxy-modified resin described in the above-mentioned paragraph (i).

(l) A compatibilization method of resins which comprises the step of compatibilizing at least one resin selected from the group consisting of the modified resin described in the above-mentioned paragraph (a) and the epoxy-modified resin described in the above-mentioned paragraph (i) with one or more other resins.

(m) A surface modification method of a resin which comprises the step of using at least one resin selected from the group consisting of the modified resins described in the above-mentioned paragraphs (b) to (d) and the epoxy-modified resin described in the above-mentioned paragraph (i).

(n) A coating resin composition which comprises at least one resin selected from the group consisting of the modified resins described in the above-mentioned paragraphs (b) to (d) and the epoxy-modified resin described in the above-mentioned paragraph (i).

(o) An adhesive resin composition which comprises at least one resin selected from the group consisting of the modified resins described in the above-mentioned paragraphs (b) to (d) and the epoxy-modified resin described in the above-mentioned paragraph (i).

According to the preparation method of the present invention, a functional group which is excellent in flame retardancy, thermal stability, compatibility, surface modification properties and the like can be introduced and bonded to a resin without any deterioration of the resin. The utilization of this technique permits obtaining a flame-retardant material having a good char formability, a thermally stable material which can retard the heat deterioration of molded articles, a new material which is excellent in miscibility and compatibility with another resin, a material having a modified surface properties which is excellent in adhesive properties, coating properties, wettability and dyeability, a coating resin composition and an adhesive resin composition.

DETAILED DESCRIPTION OF THE INVENTION

A. In a norbornenyl group-containing compound regarding the present invention, $R_1$, $R_2$, $R_3$, $R_4$, $R_5$, $R_6$, $R_7$, $R_8$ and $R_9$ each in a formula (1) is a hydrogen atom, an alkyl group having 1 to 4 carbon atoms or a phenyl group, and they may be the same or different. No particular restriction is put on the number, position and steric configuration of these groups. However, the norbornenyl group-containing compounds in which $R_1$, $R_2$, $R_3$, $R_4$, $R_5$, $R_6$, $R_7$, $R_8$ and $R_9$ are each selected from the hydrogen atom, a methyl group and the phenyl group are preferable from the viewpoints of the availability easiness of raw materials and the easiness of preparation, purification and the like, and the norbornenyl group-containing compound in which they are the hydrogen atoms is more preferable. The norbornenyl group-containing compound has at least one group represented by the formula (1), and the number of this group can be suitably selected in compliance with a use purpose, but it is usually in the range of from 1 to 10, preferably 1 to 5, more preferably 1 or 2 in consideration of the availability easiness of the compound. When the two or more groups of the formula (1) are used, these groups may be the same or different, but they are preferably the same in view of the availability easiness of the compound.

Y in the formula (1) is a triazinyl group which may have a substituent, an amido group, a carboxylate group, an oxazolinyl group, an oxycarbonyl group, an urethane group, a cyanuric acid ester group, an ether group, a carbamoyl group or a carbonyl group, but it is preferably the triazinyl group which may have a substituent, the amido group, the carboxylate group or the oxazolinyl group in view of the availability easiness of raw materials and the impartment of characteristics to an obtained modified resin. Particularly, the triazinyl group is preferable.

Typical examples of the norbornenyl group-containing compound regarding the present invention include 2-(4,6-diamino-1,3,5-triazin-2-yl)-bicyclo[2.2.1]hept-5-ene (norbornenecarboguanamine), 2-(4,6-diamino-1,3,5-triazin-2-yl)-7-methyl-bicyclo[2.2.1]hept-5-ene, 2,-methyl-2-(4,6-diamino-1,3,5-triazin-2-yl)-5-bicyclo[2.2.1]heptene, 2-carbamoyl-5-norbornene, N-ethyl-5-norbornene-2-carboxyamide, N-phenyl-5-norbornene-2-carboxyamide, 1,6-bis(5-norbornene-2-carboxyamido)hexane, 4,4'-bis(5-norbornene-2-carboxyamido)diphenyl ether, 1,4-bis(5-norbornene-2-carboxyamido)-benzene, benzoic acid 2-(5-norbornene-2-carboxyamido)ethyl ester, 5-norbornene-2-carboxylic acid octyl ester, 5-norbornene-2-carboxylic acid benzyl ester, 1,6-bis(5-norbornene-2-carboxylic acid) hexamethylene diester, 5-norbornene-2-carboxylic acid methyl ester, 2-methyl-5-bicyclo[2.2.1]heptene-2-carboxylic acid butyl ester, 2-(5-bicyclo[2.2.1]hepten-2-yl)-2-oxazoline, benzoic acid (5-norbornen-2-yl)ester, isophthalic acid bis(5-norbornen-2-yl)diester, 5-norbornene-2-methanolacrylate, 5-bicyclo[2.2.1]hepten-2-yl acetate, 2-benzyloxy-5-norbornene, (5-norbornen-2-yl)phenyl ketone, (5-norbornen-2-yl)methyl ketone, 5-norbornene-2- carbonyl chloride, norbornenecarboguanamines represented by the formula (2), their N-monosubstituted norbornenecarboguanamine derivatives, N,N'-disubstituted norbornenecarboguanamine derivatives, N,N',N"-trisubstituted norbornenecarboguanamine derivatives, N,N',N",N"'-tetrasubstituted norbornenecarboguanamine derivatives, derivatives obtained by reacting 2-hydroxy-5-norbornene, 2-amino-5-norbornene and the like with organic isocyanates, carboxylic acids and chlorinated cyanuric acids, addition condensates of the norbornenecarboguanamines represented by the formula (2) and aldehydes, and etherified condensates obtained by etherifying the addition condensates and alcohols. Preferable are the compounds represented by the formula (2), derivatives obtained by reacting 5-norbornene-2-carbonyl halides with amines and alcohols, derivatives obtained by reacting 2-(bicyclo[2.2.1] hept-5-en-2-yl)-2-oxazoline with carboxylic acids such as monocarboxylic acids and dicarboxylic acids, addition condensates of the compounds represented by the formula (2) and aldehydes, etherified condensates obtained by the etherification reaction of the addition condensates and alcohols. These exemplified compounds are not restrictive.

The norbornenyl group-containing compound regarding the present invention can be obtained by a known method. For example, there are a method which comprises reacting cyclopentadienes which may have an alkyl group of 1 to 4 carbon atoms or a phenyl group, e.g., cyclopentadiene, dicyclopentadiene, 1-methylcyclopentadiene, 2-methylcyclopentadiene, 5-methylcyclopentadiene, methylcyclopentadiene dimer, 5-ethylcyclopentadiene, 1-ethyl-3-methylcyclopentadiene, 3-isopropyl-1-methylcyclopentadiene, 5-isopropylcyclopentadiene, 1,2,3,4-tetraphenylcyclopentadiene, 1,2,4-triphenylcyclopentadiene or 1,4-diphenylcyclopentadiene, preferably cyclopentadiene with an unsaturated compound, e.g., (meth)acrylic acid, β-phenylacrylic acid, (meth)acrylic acid ester, vinyl acetate, crotonaldehyde, methyl vinyl ketone or vinyl phenyl ketone; and a method which comprises subjecting a norbornenyl group-containing compound to hydrogenation reaction, oxidation, reduction reaction, esterification reaction, ester exchange reaction, halogenation or urethane formation reaction. These methods are not restrictive.

As the norbornenyl group-containing compound in which Y in the above-mentioned formula (1) is the triazinyl group which may have a substituent, the compound represented by the formula (2) is particularly useful. This compound can be obtained by, for example, a method which comprises a ring closing reaction of 2-cyano-5-norbornene and dicyandiamide, or another method which comprises a ring closing reaction of a 5-norbornene-2-carboxylic acid ester and a biguanide. These methods are very useful.

Furthermore, the norbornenyl group-containing compound in which Y in the above-mentioned formula (1) is the amido group can be obtained by, for example, a method using a known amidation reaction of an amine having one or more carbon atoms and a 5-norbornene-2-carbonyl halide, and this method is particularly useful.

Such an amine is preferably a compound having an amino group or an imino group of one or more carbon atoms, and example of the amine include, but are not limited to, aliphatic, alicyclic, aromatic and heterocyclic amines such as methylamine, ethylamine, butylamine, octylamine, cyclohexylamine, aniline, hexamethylenediamine, 1,4-diaminomethylcyclohexane, 2,5-diaminomethylnorbornane and 1,4-diaminobenzene.

The norbornenyl group-containing compound in which Y in the above-mentioned formula (1) is the amido group can also be obtained by, for example, a method utilizing a known ring opening reaction of a carboxylic acid having one or more carbon atoms with 2-(bicyclo-[2.2.1]hept-5-en-2-yl)-2-oxazoline, and this method is also useful.

Examples of the above-mentioned carboxylic acid include, but are not limited to, aliphatic, alicyclic and aromatic carboxylic acids having one or more carbon atoms such as propionic acid, cyclohexylcarboxylic acid, benzoic acid, adipic acid and isophthalic acid.

The norbornenyl group-containing compound in which Y in the above-mentioned formula (1) is the carboxylate group can be obtained by a known method, for example, a method which comprises the esterification reaction of an alcohol having four or more carbon atoms with a 5-norbornene-2-carbonyl halide, or a method which comprises the ester exchange reaction of the above-mentioned alcohol with 5-norbornene-2-carboxylic acid methyl ester. These methods are very useful.

Examples of this alcohol include, but are not limited to, aliphatic, alicyclic and aromatic alcohols having one or more hydroxy group carbon atoms such as butyl alcohol, hexyl alcohol, cyclohexanol, benzyl alcohol, 1,6-hexanediol and 1,4-cyclohexanediol.

Furthermore, the norbornenyl group-containing compound which has the group represented by the above-mentioned formula (1) can be obtained by a known method, for example, a method which comprises the reaction of 2-hyroxy-5-norbornene with a carboxylic acid or an isocyanate, a method which comprises the reaction of sodium alcoholate of 2-hyroxy-5-norbornene and a halogenated alkyl compound or a halogenated cyanuric acid which may have a substituent, or a method which comprises the reaction of a 5-norbornene-2-carbonyl halide and ammonia or an organic cadmium compound. According to these methods, there can be provided the norbornenyl group-containing compound in which Y is an oxycarbonyl group, an urethane group, a cyanuric acid ester group, an ether group, a carbamoyl group, a carbonyl group or the like.

Particularly preferable examples of the norbornenyl group-containing compounds regarding the present invention include compounds represented by the formula (2), addition condensates of these compounds and aldehydes, and the etherified condensates obtained by the etherification reaction of the addition condensate and alcohols. Modified resins obtained by the use of these compounds are excellent in flame retardancy, thermal stability, compatibility, surface modification properties, coating properties, adhesive properties, miscibility with additives and the like, stickiness to a reinforcing material, dyeability and electrical properties; they scarcely bring about color change and quality change at the time of high-temperature working, are excellent in weathering resistance and heat resistance and the like, so that they can maintain a modification effect for a long period of time; and since they have an amino group which is excellent in reactivity, the desired denaturation or modification can be carried out by reaction with this amino group.

In the norbornenyl group-containing compound [the formula (2)] regarding the present invention, $R_{10}$, $R_{11}$, $R_{12}$ and $R_{13}$ are selected from the group consisting a hydrogen atom and groups having one or more carbon atoms, and $R_{10}$, $R_{11}$, $R_{12}$ and $R_{13}$ are the same or different. No particular restriction is put on the number, position and steric configuration of these groups, and useful examples of the groups include aliphatic, alicyclic, aromatic and heterocyclic groups which have one or more carbon atoms and which may have a functional group or a branched chain such as a hydroxyl group, an ester group, an ether group, a carboxylic acid group, a carbonyl group, an amido group, an imido group, a nitro group, a sulfonate group, a sulfonamido group, an amino group, an imino group or an unsaturated group.

Typical examples of the groups represented by $R_{10}$, $R_{11}$, $R_{12}$ and $R_{13}$ include, but are not limited to, a hydrogen atom, methyl, ethyl, isopropyl, n-butyl, 2-ethylhexyl, octadecyl, allyl, oleyl, 4-methylcyclohexyl, phenyl, o-tolyl, α-naphthyl, benzyl, β-phenetyl, o-methoxycarbonylphenyl, p-ethoxycarbonylphenyl, methoxymethyl, butoxymethyl, stearyloxymethyl, 4-methoxyphenyl, tetrahydrofurfuryl, 2-(1-piperazinyl)ethyl, 2-(piperazino)ethyl, 2-(morpholino) ethyl, 2-(1-pyrrolidinyl)ethyl, 2-pyridinyl, methylol, 2-hydroxyethyl, 2-hydroxypropyl, 4-hydroxybutyl, 5-hydroxypentyl, 12-hydroxydodecyl, 1-(2-hydroxyethyl)-2-propenyl, 1-(1-hydroxypropyl)-3-pentenyl, 5-hydroxy-3-oxapentyl, 1-(2-hydroxyethyl)-4-oxahexyl, 4-hydroxycyclohexyl, 4-hydroxyphenyl, 4-hydroxynaphthyl, 4-(hydroxymethyl)phenyl, 2-(4-hydroxyphenyl)ethyl, 3-hydroxypyridin-2-yl and 8-hydroxyquinolin-4-yl.

Typical examples of the norbornenyl group-containing compound [the formula (2)] regarding the present invention include, but are not limited to, 2-(4,6-diamino-1,3,5-triazin-2-yl)-bicyclo[2.2.1]hept-5-ene, 2-(4,6-diamino-1,3,5-triazin-2-yl)-3-methyl-bicyclo[2.2.1]-hept-5-ene, 2-(4,6-diamino-1,3,5-triazin-2-yl)-7-methyl-bicyclo[2.2.1]hept-5-ene, 2-(4,6-diamino-1,3,5-triazin-2-yl)-3-phenyl-bicyclo[2.2.1]hept-5-ene, 2-(4,6-diamino-1,3,5-triazin-2-yl)-7-isopropyl-bicyclo[2.2.1]hept-5-ene, 2-(4,6-diamino-1,3,5-triazin-2-yl)-4-ethyl-6-methyl-bicyclo[2.2.1]hept-5-ene, 2-(4,6-diamino-1,3,5-triazin-2-yl)-1,4-diphenyl-bicyclo[2.2.1]hept-5-ene, their N-mono(di/tri/tetra)-substituted norbornenecarboguanamines such as N-hydroxymethyl-norbornenecarboguanamine, N-hydroxymethyl-3-methyl-norbornenecarboguanamine, N-(2-hydroxyethyl)-norbornenecarboguanamine, N-(5-hydroxy-3-oxapentyl)-norbornenecarboguanamine, N-methoxymethylnorbornenecarboguanamine, N-butoxymethyl-norbornenecarboguanamine, N-stearyloxymethyl-norbornenecarboguanamine, N-ethyl-norbornenecarboguanamine, N-octyl-norbornenecarboguanamine, N-cyclohexyl-norbornenecarboguanamine, N-phenyl-norbornenecarboguanamine, N-(2-morpholinoethyl) norbornenecarboguanamine, addition condensates of the compounds represented by the formula (2) and aldehydes, and etherified condensates obtained by the etherification reaction of the addition condensate and alcohols.

Examples of the aldehydes, which can be used for the preparation of the N-substituted norbornenyl group-containing compounds represented by the above-mentioned formula (2) and their condensates, include formaldehydes such as formaldehyde, paraformaldehyde, hexamethylenetetramine, methylhemiformal, butylhemiformal and formaldehyde-sodium bisulfate adduct, glyoxal, acetaldehyde, trimethylolacetaldehyde, acrolein, benzaldehyde, furfural, phthalaldehyde and terephthalaldehyde, and above all, the formaldehydes and glyoxal are preferable and an aqueous formaldehyde solution and paraformaldehyde are more preferable. They are not restrictive. The amount of the aldehyde to be used is usually in the range of from 0.5 to 20 mols, more preferably 0.7 to 10 mols per mol of an amino compound comprising the norbornenyl group-containing compound [the formula (2)] and if necessary, a co-condensable compound.

As the above-mentioned alcohols which can be used for the etherification reaction in the preparation of these condensates, useful are saturated and unsaturated aliphatic alcohols having 1 to 20 carbon atoms, alicyclic alcohols, alcohols having an ether group and alcohols having an aromatic group. Examples of these alcohols include, but are not limited to, methyl alcohol, isopropyl alcohol, n-butyl alcohol, tert-butyl alcohol, 2-ethylhexyl alcohol, n-nonyl alcohol, n-octadecyl alcohol, n-eicocyl alcohol, cyclohexyl alcohol, cyclohexenyl alcohol, 4-methylhexyl alcohol, ethylene glycol monomethyl ether, propylene glycol monoisopropyl ether, diethylene glycol monomethyl ether and benzyl alcohol.

The use ratio of the norbornenyl group-containing compound [the formula (2)] in the condensate regarding the present invention can be suitably selected in consideration of the desired performance, but in order to accomplish a good solubility and dispersibility in the resin and in order to obtain the modified resin having excellent flame retardancy, thermal stability, compatibility, miscibility with additives, surface modification properties, coating properties, adhesive properties, dyeability, electrical properties, moldability, solvent resistance, weathering resistance, impact resistance, wear resistance and the like, the amount of the norbornenyl group-containing compounds to be used is preferably 40 wt % or more, more preferably 60 wt % or more based on the weight of an amino compound comprising the norbornenyl group-containing compound [the formula (2)] and if necessary, the co-condensable compound.

In the preparation of the condensate, the co-condensable compound can be used on occasion as described above, and examples of the co-condensable compound include, but are not limited to, melamine, N-methylmelamine, benzoguanamine, acetoguanamine, cyclohexanecarboguanamine, cyclohexenecarboguanamine, norbornanecarboguanamine, CTU-guanamine, adipoguanamine, dicyandiamide, urea, alkylurea, thiourea, alkylthiourea, guanidine, urethane, phenol, p-methylphenol, nonylphenol, resol, aniline, tetramethylenediamine, furfural, furfuryl alcohol, p-toluenesulfonamide, o-toluenesulfonamide, benzenesulfonamide, tetralinsulfonamide, carboxylic acid amide, sulfuryl amide and diamide phosphorus nitride low polymer. The amount of the co-condensable compound to be used should be such as not to impair the significance of the norbornenyl group-containing compound [the formula (2)], and it is preferably less than 60 wt % in the amino compound.

With regard to the formation of the N-methylol compound of the above-mentioned norbornenyl group-containing compound [the formula (2)], its formation reaction promptly and smoothly proceeds under conditions of pH of 8.0 to 13.0, preferably 8.5 to 11.5 and a reaction temperature of 30° C. or more, preferably 40° to 80° C. in a solvent, if necessary, in the presence of a basic compound, to obtain the compound having at least one HOCH2 group. When the N-methylol compound containing the methylol group at a high content is intended, the reaction is carried out decreasing the amounts of water and an alcohol to obtain the desired compound in a high purity and a high yield. However, if the amounts of water and the alcohol are excessively decreased, the deterioration of a stirring effect and the nonuniform state of a reaction temperature take place, thereby impeding the smooth reaction inconveniently. In order to smoothly accomplish the reaction, it is useful to suitably employ a method which comprises carrying out the reaction in the presence of a solvent which is substantially insoluble in water and does not disturb the reaction, for example, an aromatic hydrocarbon, an aliphatic hydrocarbon, a halogenated hydrocarbon or an aliphatic ether, or another method which comprises adding 0.01 to 10 mol % of an auxiliary of, an amine such as an alicyclic amine, an aliphatic amine, an aromatic amine or ammonia to an aldehyde. These methods are not restrictive.

The etherified compound of the above-mentioned norbornenyl group-containing compound [the formula (2)] can be obtained by, for example, an etherification reaction of the above-mentioned N-methylol compound at a temperature of 40° to 80° C. for 1 to 8 hours under acidic conditions of a pH 2 to 4 in the presence of the above-mentioned alcohol. In this case, it is particularly preferable that a water content in the reaction system is as low as possible and the molar ratio of the alcohol per mol of the N-methylol compound is 10 mols or more.

No particular restriction is put on a method for obtaining the condensate regarding the present invention, but for example, the condensate can be obtained by stirring and mixing the above-mentioned amino compound and aldehyde in one or more solvents of water, an alcohol, an aromatic compound and the like, and then reacting them at a temperature of 40° to 100° C. under conditions of pH 8.0 or less or pH 13.0 or more.

The above-mentioned etherified condensate can be obtained by, for example, carrying out an etherification reaction or simultaneously carrying out the etherification reaction and a condensation reaction of the above-mentioned N-methylol compound or its condensate in the presence of the above-mentioned alcohol at a temperature of 50° to 120° C. under acidic conditions of pH 1.0 to 5.0. This method is not restrictive.

Condensates, cured compounds and polymer fine particles having an increased condensation degree are also similarly useful, which can each be obtained by treating the above-mentioned norbornenyl group-containing compound [the formula (2)], its condensate and the etherified condensate with a curing agent, for example, a mineral acid, a carboxylic acid, a sulfonic acid, its ammonium salt, or a compound capable of releasing or forming protons under conditions for the manufacture such as an aqueous metallic salt of a metal and an acid such as nitric acid, sulfonic acid or phosphoric acid.

In the preparation method of the present invention, the amount of the above-mentioned norbornenyl group-containing compound to be used is usually in the range of from 0.01 to 60 wt %, preferably from 0.01 to 40 wt % based on the weight of the resin, depending upon an application purpose and the like. Even if the norbornenyl group-containing compound is used in large quantities, the modified resin scarcely gives rise to the deterioration and change of physical properties such as coloring and the noticeable decrease of molecular weight. Thus, the method for preparing modified resins can be considered to be extremely useful in many fields.

The preparation method of the aforesaid modified resin regarding the present invention can be carried out by reacting a resin with the above-mentioned norbornenyl group-containing compound in a temperature range of from 200° to 450° C., but this temperature range depends upon the kind of selected norbornenyl group-containing compound. When at least one of the norbornenyl group-containing compounds mentioned in the above-mentioned paragraphs (b) to (h) is used, the reaction is done in a temperature range of from 230° to 450° C., preferably from 240° to 400° C., more preferably from 250° to 400° C. If one of the norbornenyl group-containing compounds mentioned in the above-mentioned paragraphs (b) to (h) is used and the reaction temperature is less than 230° C., the reaction rate is noticeably low and yield is also noticeably low. The upper level of the reaction temperature is such as scarcely to bring about the deterioration and the like of the resin, and so the upper temperature is usually 450° C., preferably 400° C. or less. Even if the reaction temperature is in excess of a use temperature range at the time of the kneading or molding of the material resin, the modified resin scarcely gives rise to quality change such as heat deterioration, coloring and the like by virtue of the extremely excellent thermal stability and heat resistance which the modified resin has. In consequence, the reaction can be advanced in the good yield, so that the modified resin having excellent characteristics and physical properties can be obtained.

The above-mentioned reaction can be carried out in the presence or absence of a solvent, and therefore the solvent can be suitably selected and used in consideration of manufacturing conditions, raw materials and the like. Nevertheless, it is preferable that the reaction is done in the absence of the solvent.

No particular restriction is put on the procedure of the reaction, and either of a batch reaction system and a continuous reaction system is acceptable. A known solution method, molting method, reactive processing method in which the reaction is done in the working step of the resin, and the like are applicable, and from these methods, suitable one can be selected. Nevertheless, a certain method is preferable which comprises kneading the resin and the norbornenyl group-containing compound in the absence of a solvent in a nitrogen atmosphere by a machine for kneading such as a kneader, a single screw extruder, a twin-screw extruder, heating rolls or a Bumbury's mixer, and then extruding the mixture after the reaction has finished or while the reaction is proceeding. According to this preferable method, the reaction can be accomplished in an extremely short time without requiring any complex step, and the extrusion can also be done by one step to obtain the continuously and uniformly modified resin.

The above-mentioned reaction can be suitably accomplished under atmospheric pressure, under spontaneously generated pressure in a sealed container, under applied pressure or under reduced pressure, but it is preferable that for the removal of a gas such as cyclopentadienes generated during the reaction, a vent or the like is disposed and the reaction is done under the atmospheric pressure or reduced pressure.

In the preparation method of the present invention, the addition of a reaction catalyst, an initiator or the like is not required, but an organic peroxide such as benzoyl peroxide, lauroyl peroxide or dicumyl peroxide can be suitably selected and added as the initiator, if necessary, so far as the significance of the present invention is not impaired. However, the employment of the initiator tends to bring about the deterioration of electrical properties and mechanical properties due to the decrease of the molecular weight of the resin, and the decline of heat deterioration, color change, quality change, heat resistance and thermal stability, and for this reason, the use of the initiator is noticeably limited and so no initiator is preferable. The preparation method of the present invention permits the modification of the resin without requiring the addition of the initiator, so that this method is not accompanied with the above-mentioned defects attributable to the use of the initiator. Hence, the preparation method of the present invention can be considered to be very excellent.

As the resin regarding the present invention, any resin is usable, so far as it has a hydrocarbon group. In view of molecular weight, the resins range from high-molecular weight materials such as usual resins and rubbers to low-molecular weight materials such as waxes and oils, and in view of melting viscosity and Mooney viscosity, the resins range from high-viscosity materials to low-viscosity materials. Thus, the resin can be suitably selected in compliance with an application purpose in consideration of these characteristics. According to the preparation method of the modified resin of the present invention, the modification can be achieved by introducing and bonding the necessary amount of a functional group which can scarcely be introduced and bonded at the time of the manufacture of the resin, and therefore this preparation method is particularly useful for high-molecular weight materials such as usual resins and rubbers as well as resins having no functional group, for example, polyolefin resin, olefin thermoplastic elastomers such as ethylene-propylene rubbers (EP rubbers), ethylene-propylene-diene terpolymer (EPDM) and ethylene oxide rubber (EOR), hydrocarbon-containing synthetic waxes, and hydrocarbon oils.

Examples of the useful resins regarding the present invention include thermoplastic resins, thermosetting resins, rubbers, blends thereof, block copolymers, graft copolymers, modified resins such as rubber-modified polymers, natural resins, waxes, oils and the like.

Typical examples of these resins include, but are not limited to, usual resins, for example, thermoplastic resins such as polystyrene resins such as polystyrene, copolymers and terpolymers of styrene and other monomers [e.g., maleic anhydride, α-methylstyrene, butadiene, acrylonitrile and (meth)acrylic esters, rubber-modified polystyrenes, rubber-modified styrene-acrylonitrile copolymers and rubber-modified styrene-maleic anhydride copolymers; polyolefin resins such as polyethylene, polypropylene, polybutylene, poly-3-methylbutene, ethylene-vinyl acetate copolymers, ethylene-propylene copolymers and EPDMs; (meth)acrylic resins such as polymethyl acrylate and polymethyl methacrylate; polyamide resins such as nylon 4, nylon 6, nylon 12, nylon 66, nylon 612 and copolymerized nylons; saturated polyester resins such as polyethylene terephthalate and polybutylene terephthalate; polyphenyleneether resins such as poly(2,6-dimethyl-1,4-phenylene)ether, poly(2-methyl-6-ethyl-1,4-phenylene)ether, poly(2-methyl-6-chloro-1,4-phenylene)ether, poly(2-methyl-6-hydroxyethyl-1,4-phenylene)ether, copolymers of 2,6-dimethylphenol and 2,3,6-trimethylphenol, end-capped polyphenylene ether resins thereof and resins obtained by modifying them with the styrene resins and the polyamide resins; polyacetal resins, polyvinyl chloride, polyvinylidene chloride, chlorinated polyethylene, chlorinated polypropylene, chlorinated rubber, copolymers and terpolymers of vinyl chloride and other monomers [e.g., vinyl acetate, ethylene, propylene, styrene, isobutylene, vinylidene chloride, maleic anhydride, acrylonitrile, butadiene, isoprene, chlorinated propylene and (meth)acrylic esters], polyvinyl bromide, brominated polyethylene, polyvinyl fluoride, polyvinylidene fluoride, tetrafluoroethylene-propylene resins, fluorinated resins, vinyl acetate resin, polyamideimides, polyimide resins, polyetherimides, polyphenylene sulfide resins, polyethersulfones, polysulfone resins, polyamine-sulfones, polycarbonates, liquid crystal (polyester) polymers, cyclic polyolefins, polyether ether ketone, polyarylates, phenoxy resins, silicone resins and blends of these resins, block copolymers, graft copolymers and rubber-modified polymers of these resins; thermosetting resins such as diallyl phthalate resins such as diallyl phthalate and diallyl-2,6-naphthalene dicarboxylate; unsaturated polyester resins such as maleic acid (fumaric acid)-containing polyester-styrene resins; urethane resins, epoxy resins, silicone resins, phenol resins, furan resins, amino resins, blends of these resins and resins obtained by modifying these reins with rubber or the like; petroleum resins, dicyclopentadiene (DCPP) resins, natural resins such as cellulose powder, cellulose acetate, carboxymethyl cellulose, hydroxyethyl cellulose, methyl cellulose, polyglutamic acid and polyterpene; and modified resins thereof.

In addition, typical examples of the resins include, but are not limited to, rubbers, for example, synthetic rubbers such as styrene-butadiene rubbers (SBRs), butadiene rubbers (BRs), isoprene rubbers (IRs), EP rubbers, EPDM rubbers, acrylonitrile-butadiene rubbers (NBRs), EORs, chloroprenes, butyl rubbers (IIRs), urethane rubbers, silicone rubbers, polysulfide rubbers, hydrogenated nitrile rubbers, polyether rubbers, fluorinated rubbers, tetrafluoroethylene-propylene rubbers, acrylic rubbers, chlorosulfonated polyethylene rubbers, epichlorohydrin rubbers, propylene oxide rubbers, ethylene-acrylic rubbers, liquid rubbers, norbornene rubbers, thermoplastic elastomers such as styrene-containing thermoplastic elastomers, olefin-containing thermoplastic elastomers, urethane-containing thermoplastic elastomers, polyester-containing thermoplastic elastomers, polyamide-containing thermoplastic elastomers, 1,2-polybutadiene-containing thermoplastic elastomers, vinyl chloride-containing thermoplastic elastomers and fluorine-containing thermoplastic elastomers, natural rubbers; waxes, for example, paraffin waxes, microcrystalline waxes, polyethylene waxes such as Mitsui High Waxes 800P, 400P, 100P, 410P, 220P, 110P, NL800, NL500 and NL100 [Mitsui Petrochemical Industries, Ltd.], polypropylene waxes such as Mitsui High Waxes NP055, NP105 and NP805 [Mitsui Petrochemical Co., Ltd.], synthetic waxes such as Fischer-Tropsch waxes, natural waxes such as carnauba wax, sugarcane wax, palm wax, Japan wax, bees wax, spermaceti and montan wax; oils such as hydrocarbon oils, silicone oils, lubricating oils, natural oils and fats, blends thereof, and modified substances thereof.

According to the preparation method of the present invention, a various functional group can be introduced into the resin, and therefore the resin which has been modified by the above-mentioned method can be further subjected to a modification reaction to further advance the modification. The modified resin obtained by the use of the norbornenyl group-containing compound represented by [the formula (2)] has an active amino group which is excellent in reactivity, and the modification of the resin can further be advanced by a modification reaction with an aldehyde, an epoxide, a carboxylic acid (anhydride), an isocyanate, an oxazoline, a silane or a silane coupling agent, preferably the epoxide, whereby various kinds of excellent materials can be suitably provided.

According to a method for preparing an epoxy-modified resin regarding the present invention, the modified resin obtained by the use of the above-mentioned norbornenyl group-containing compound [the formula (2)] is reacted with an epoxide under specific reaction conditions to obtain the epoxy-modified resin, which can be easily manufactured and in which surface properties such as coating properties, adhesive properties, wettability, dyeability, water/oil repellency, solvent resistance and stickiness to a reinforced material are noticeably improved; compatibility with and dispersibility in another resin are further improved; high-temperature stability and non-volatility are excellent, and so the generation of sublimation and breeding is inhibited; and a new material having improved physical properties can be provided as a compatibilizer for different resins. In consequence, the excellent modification method of a resin can be provided.

No particular restriction is put on the kind of epoxide regarding the present invention, and compounds having an aliphatic group, an alicyclic group and a heterocyclic group can widely be used, so far as each of these compounds has one or more epoxy groups.

Typical examples of the epoxide include, but are not limited to, bisphenol type epoxy resins such as bisphenol A, bisphenol F, halogenated bisphenol A's, cresolnovolak type epoxy resins, phenolnovolak type epoxy resins, phenolnovolak type halogenated epoxy resins and naphthalene type epoxy resins, α-olefin epoxides having 1 to 40 carbon atoms, cyclohexene oxide, cyclopentadiene monoxide, butadiene dioxide, epoxidized linseed oil, styrene epoxide, methyl glycidyl ether, butyl glycidyl ether, allyl glycidyl ethers, phenyl glycidyl ethers, alkylphenyl glycidyl ethers, 4,4-di (1,2-epoxyethyl)diphenyl ether, diglycidyl ether of resorcin, diglycidyl ether of phloroglucinol, triglycidyl ether of p-aminophenol, tetraglycidyl-bis-(aminophenyl)methane, terephthalic acid diglycidyl ether, 1,3,5-tri(1,2-epoxyethyl) benzene, 2,2,4,4-tetraglycidoxy benzophenone, hexanediol diglycidyl ether, 2-ethylhexyl glycidyl ether, neopentyl glycol diglycidyl ether, polyethylene glycol diglycidyl ether, polypropylene glycol diglycidyl ether, polyglycidyl ether of pentaerythritol, vinylcyclohexene dioxide, 3,4-epoxycyclohexylmethyl-3,4-epoxycyclohexane carboxylate, alicyclic epoxy resins such as trade names "Seroxide #2000", "Seroxide #2021", "Seroxide #3000", "Seroxide #4000" made by Daisel Ltd., trade names "Epicoat #1100L" made by Yuka Shell Epoxy Co., Ltd., aromatic amine--containing digycidyl ethers, hydantoin epoxy resin, hetrocyclic epoxy resins such as triglycidyl isocyanurate, polymers of epoxy group-containing vinyl monomers such as gycidyl(meth)actylate and copolymerizable compounds, and epoxy group-containing resins obtained by modifying polyphenyleneether resins, polyamide resins, polypropylene resins and saturated polyester resins with epichlorohydrin or glycidol.

The amount of the epoxide regarding the present invention can be suitably selected, but it is such that the epoxy group in the epoxide is usually in the range of from 0.1 to 5.0 equivalents, preferably from 0.2 to 3.0 equivalents per equivalent of an amino group which bonds to triazine ring in the above-mentioned modified resin.

The preparation method of the epoxy-modified resin regarding the present invention is carried out by thermally reacting the modified resin obtained by the above-mentioned method with the epoxide, but the temperature of the thermal reaction is 150° C. or more, preferably in the range of from 150° to 400° C., more preferably from 150° to 350° C. If the reaction temperature is less than 150° C., the reaction is noticeably slow and yield is unpreferably low. Therefore, the reaction temperature should be 150° C. or more. Moreover, the reaction temperature should be within the range in which the resin scarcely deteriorates, and the reaction is usually done at a temperature of 350° C. or less.

The above-mentioned reaction can be suitably carried out by a solution method, a latex method, a melting method, a reactive processing or the like, as in the preparation method of the modified resin. Nevertheless, a certain method is preferable which comprises kneading the modified resin and the epoxide continuously in the same system as in the preparation of the modified resin after the preparation of the modified resin in the absence of a solvent by a single screw extruder, a twin-screw extruder, heating rolls, a Bumbury's mixer or a kneader, and then extruding the mixture after the reaction has finished or while the reaction is proceeding. This preferable method has the same excellent points as described above.

In the preparation method of the epoxy-modified resin, a reaction accelerator can be suitably selected and used, and examples of the reaction accelerator include a metallic salt of an organic acid such as tin octylate, imidazoles and novolak type phenol resins.

The modified resins and the epoxy-modified resins regarding the present invention are excellent modification and improvement in physical properties such as flame retardancy, thermal stability, heat resistance, impact resistance, high strength and high elasticity, resin compatibility, flexing resistance and fatigue resistance, wear resistance, tear resistance, dimensional stability, stress relaxation, vibration-damping properties, heat resistance and cold resistance, solvent resistance (oil and water), weathering resistance, gloss, refractive index change, self-lubrication, plasticity and gas barrier properties as well as adhesive properties, stickiness to a reinforcing material such as a glass fiber, sliding properties, plating properties, coating properties with a paint or the like, dyeability of a resin or its fiber, blocking resistance, electrical properties such as electrical inhibition properties, conductivity, static properties and tracking resistance, fluidity, retraction, heat fusion strength, flow moldability, crystallinity, orientation, operating characteristics such as moldability or workability, and economical properties such as saving of resources and substitution for resources. Therefore, the modified resins and the epoxy-modified resins of the present invention are industrially very useful in a wide range as construction materials, interior decorations, housewares such as bathtubs and toilets, interior decorations and exterior decorations for vehicles, e.g., cars such as instrument panels, pillars, meter clusters, door trims, armrests, defroster garnishes, console boxes, pocket decks, bumpers, side sill garnishes, cowl top garnishes, wheel covers, spoilers and head lamp inner panels, reinforcing and molding materials such as long and short glass fibers, electrical materials such as resist materials and electrically insulating materials, electrophotographic materials such as toners, fibrous materials, fiber and paper making materials, paints for cars and appliances, antifouling and anticorrosive paints, powdered paints, traffic paints, adhesives such as hot-melt adhesives, tackifying resin and adhesives for structures such as industrial articles, IC sealing compounds, rubber modifiers, optical materials, leather treating solutions, agricultural materials, medical instruments, packing materials, equipments for foods such as containers, fibers such as tents, cloths and wear, mechanical equipments such as gears and packings, antifouling and anticorrosive equipments such as pipes and tanks, heat-resistant equipments, warmth keeping materials and cold keeping materials, oil modifiers, flame-retardants, surface active agents, rust preventives, antioxidants and the like.

B. In the flame-retarding method of a resin regarding the present invention, at least one of the modified resins described in the above-mentioned paragraphs (b) to (d) and the epoxy-modified resin described in the above-mentioned paragraph (i) can be used in a suitable amount, and the modified resin may occupy a total portion or a partial portion of the resin. Practically, the modified resin is used in such an amount that the content of a triazine nucleus in the resin is in the range of from 2 to 40 wt %, preferably from 4 to 30 wt %. If the content of the triazine nucleus is less than 2 wt %, a sufficient flame retardancy effect can scarcely be obtained, and if it is more than 40 wt %, the moldability of this resin is poor, and the deterioration of the resin occurs inconveniently to lower physical properties.

In the flame-retarding method of a resin, it is particularly preferable to additionally use at least one component selected from phosphoruses consisting of simple substances of phosphorus and phosphorus-containing compounds together with the modified resin regarding the present invention in the resin. This reason is that the phosphoruses can exert a synergistic effect that a flame-retarding effect can be further improved. This excellent synergistic effect is believed to be not only due to the easy formation of a flame retardant film having a relatively low volatility on a burning resin surface but also due to the acceleration of char formation to increase a char layer so that oxygen can be prevented from spreading to the burning surface, the release of a flammable gas from the resin portion can be inhibited, and the conduction of heat to the resin portion can be reduced.

Useful examples of such phosphoruses include, but are not limited to, simple substances of phosphorus such as red phosphorus; phosphorus-containing acids such as phosphoric acid, polyphosphoric acids, phosphorous acid, phosphonic acid, phosphate salts, polyphosphate salts, phosphite salts and phosphonate salts; phosphate esters such as phosphoric triesters, polyphosphate esters, acidic phosphate esters and salts thereof; phosphite esters such as phosphorous triesters and acidic phosphorous diesters; phosphonate esters such as phosphonate esters, acidic phosphonate esters and salts thereof; phosphines such as phosphine, phosphine oxide and phosphonium salts; and sulfur-containing phosphorus compounds such as dialkyl thiophosphates and salts thereof.

Examples of the above-mentioned phosphorus-containing acids include acids such as phosphoric acid, pyrophosphoric acid, tripolyphosphoric acid, polyphosphoric acid, phosphorous acid and phosphonic acid; and salts obtained by either partially or fully neutralizing these acids with bases such as ammonia, amines, alkali metals or alkaline earth metals, namely, ammonium phosphate, ethylenediamine phosphate, sodium phosphate, calcium phosphate, melamine pyrophosphate, sodium pyrophosphate, ammonium tripolyphosphate, sodium tripolyphosphate, ammonium polyphosphates, sodium polyphosphates, ammonium phosphite, calcium phosphite and ammonium phosphonate. Above all, ammonium polyphosphates represented by the formula $(NH_4)_{m+2}P_mO_{3m+1}$ (wherein m is an integer more than 5) are preferred. It is however to be noted that the above-mentioned phosphorus-containing acids are not limited to these examples.

In the above-described ammonium polyphosphates represented by the formula $(NH_4)_{m+2}P_mO_{3m+1}$ (wherein m is an integer more than 5), it is preferred to set m at a substantially large value so as to make water solubility smaller in view of the flame retarding effect and the physical properties of the resulting resin. A salt in which m is an integer more than 50 is particularly preferred. This salt practically corresponds to a metaphosphate $(NH_4PO_3)_m$.

Examples of the ammonium polyphosphates include "Exolit 263" (trade name; made by Hoechst AG), "Exolit 422" (trade name; made by Hoechst AG) and "Phoscheck P/30" (trade name; made by Monsanto Chemical Company).

Examples of the above-mentioned phosphate esters include, but are not limited to, phosphoric triesters such as trimethyl phosphate, tri-n-butyl phosphate, trilauryl phosphate, tristearyl phosphate, trioleyl phosphate, tris (butoxyethyl) phosphate, triphenyl phosphate, tricresyl phosphate, trixylenyl phosphate, cresyl diphenyl phosphate, xylene diphenyl phosphate, tris(isopropylphenyl)phosphate, isopropyl diphenyl phosphate, 2-ethylhexyl diphenyl phosphate, stearyl diphenyl phosphate, oleyl diphenyl phosphate, butyl dicresyl phosphate, lauryl dicresyl phosphate, diphenyl-2-metacroyloxy ethyl phosphate, tris (2-chloroethyl)phosphate, tris(2-chloropropyl)phosphate, tris(2,3-dichloropropyl) phosphate, tris(2,3-dibromopropyl) phosphate, tris(bromochloropropyl)phosphate and tris (tribromophenyl)phosphate; acidic phosphate esters such as mono/dimethyl acid phosphate, mono/diethyl acid phosphate, monobutyl acid phosphate, di-2-ethylhexyl phosphate, mono/dilauryl acid phosphate, mono/distearyl acid phosphate, mono/dioleyl acid phosphate, mono/di-2-chloroethyl acid phosphate, mono/dibutoxyethyl acid phosphate, ethylene glycol acid phosphate, dibutyl pyrophosphate, mono/diphenyl acid phosphate, mono/dicresyl acid phosphate, mono/dixylenyl acid phosphate; ammonia, amine, melamine, alkali metal and alkaline earth metal salts of acidic phosphate esters such as ammonium dimethyl phosphate, ammonium ethyl phoshate, ammonium di-n-butyl phosphate, triethanolamine dibutoxyethyl phosphate, morpholine dioctyl phosphate, sodium mono-n-butyl phosphate, ammonium diphenyl phosphate, melamine diphenyl phosphate, piperazine diphenyl phosphate, ammonium phenyl phosphate, ethylenediamine dicresyl phosphate, sodium cresyl phosphate and melamine dixylenyl phosphate.

Examples of the above-mentioned phosphite esters include, but are not limited to, phosphite triesters such as trimethyl phosphite, triethyl phosphite, tributyl phosphite, tris(2-ethylhexyl)phosphite, trialuryl phosphite, trioleyl phosphite, tristearyl phosphite, triphenyl phosphite, tris (nonylphenyl)phosphite, tris(2,4-di-t-butylphenyl) phosphite, tris(dinonylphenyl)phosphite, bis(nonylphenyl) dinonylphenyl phosphite, diphenyl mono(2-ethylhexyl) phosphite, diphenyl monodecyl phosphite, diphenyl mono (tridecyl)phosphite, phenyl diisooctyl phosphite, tetraphenyl dipropylene glycol diphosphite, poly(dipropylene glycol) phenyl phosphite, diisodecyl pentaerythritol diphosphite, bis(tridecyl)pentaerythritol diphosphite, distearyl pentaerythritol diphosphite, bis(nonylphenyl)pentaerythritol diphosphite, bis(2,4-di-t-butylphenyl)pentaerythritol diphosphite, phenyl 4,4'-isopropylidenediphenyl pentaerythritol diphosphite, tetraphenyl tetra(tridecyl)pentaerythritol tetraphosphite, tetra(tridecyl)-4,4'-isopropylidenediphenyl phosphite, hydrogenated bisphenol A phosphite polymer, pentaerythritol hydrogenated bisphenol A triphenyl phosphite polycondensate, tetra(tridecyl)-4,4'-n-butylidene bis (2-t-butyl-5-methylphenol)diphosphite, bis(neopentyl glycol) 1,4-cyclohexane dimethylene phosphite, bis (octylphenyl)bis[4,4'-n-butylidene bis(2-t-butyl-5-methylphenol)]1,6-hexanediol phosphite and tetra(tridecyl) -1,1,3-tris(2'-methyl-5'-t-butyl-4'-oxyphenyl)butane diphosphite; and phosphite diesters such as dimethyl hydrogenphosphite, dibutyl hydrogenphosphite, di(2-ethylhexyl)hydrogenphosphite, dilauryl hydrogenphosphite, dioleyl hydrogenphosphite and diphenyl hydrogenphosphite.

Examples of the above-mentioned phosphonic acids include, but are not limited to, phosphonate diesters such as dimethyl methylphosphonate, ethyl diethylphosphonoacetate, bis(2-chloroethyl) vinylphosphonate, diethyl N,N-bis(2-hydroxyethyl) aminomethylphosphonate, dibutyl butylphosphonate, di-2-ethylhexyl hydroxymethylphosphonate, di-2-ethylhexyl 2-ethylhexylphosphonate, dimethyl phenylphosphonate, diallyl phenylphosphonate, dioctyl phenylphosphonate and dinaphthyl phenylphosphonate; acidic phosphonate esters such as mono-2-ethylhexyl 2-ethylhexylphosphonate and monooctyl phenylphosphonate; and phosphonate ester salts such as ammonium mono-2-ethylhexyl-2-ethylhexylphosphonate, triethanolamine monooctyl phenylphosphonate, melamine mono-2-ethylhexyl 2-ethylhexylphosphonate and sodium monooctyl phenylphosphonate.

Examples of the above-mentioned phosphines include, but are not limited to, phosphines such as triethylphosphine, tri-n-octylphosphine, tris(2-cyanoethyl)phosphine, tris(3-hydroxypropyl)phosphine, tricyclohexylphosphine, triphenylphosphine, tri-p-tolylphosphine, tri(2,6-dimethoxyphenyl)phosphine, 9-phosphabi-cyclo[3.3.1], [4.2.1]nonane (mixture), bis(1,2-diphenylphosphino)ethane, bis(1,4-diphenylphosphino)butane, diphenyl-p-styrylphosphine, diphenylphosphinous chloride and bis(diphenylphosphino)ferrocene; phosphine oxides such as triethylphosphine oxide, tri-n-octylphosphine oxide, tris(2-cyanoethyl)phosphine oxide, tris(3-carboxyethyl)phosphine oxide, tris(3-hydroxypropyl)phosphine oxide and triphenylphosphine oxide; and phosphonium salts such as tetra-n-butylphosphonium bromide, tri-n-butylallylphosphonium bromide, ethylenebistris(2-cyanoethyl)phosphonium bromide, ethyltriphenylphosphonium bromide, tetraphenylphosphonium bromide, tri-n-octylethylphosphonium bromide, tetra-n-butylphosphonium O,O-diethylphosphorodithioate, tetrakis(hydroxymethyl)phosphonium sulfate, tetra-n-butylphosphonium iodide, ethyltriphenylphosphonium iodide, triethylbenzylphosphonium chloride, tetra-n-butylphosphonium chloride, tri-n-butyltetradecylphosphonium chloride, tris(2-cyanoethyl)allylphosphonium chloride, benzyltriphenylphosphonium chloride and bis(triphenylphosphin)iminium chloride.

Examples of the above-mentioned sulfur-containing phosphorus compounds include, but are not limited to, dimethyl phosphorodithioate, di-n-propyl phosphorodithioate, ammonium diethyl phosphorodithioate, melamine di-n-propyl phosphorodithioate, sodium dimethyl phosphorodithioate, trilauryl trithiophosphite, tris(lauryl-2-thioethyl)phosphite, diphenyl bis[4,4'-n-butylidene bis(2-t-butyl-5-methylphenyl)]thiodiethanol diphosphite, triphenylphosphine sulfide, tris(2-cyanoethyl)phosphine sulfide and tri-n-butylphosphine sulfide.

In the present invention, the phosphoruses can be used in an amount of 5 to 40 wt %, preferably 10 to 30 wt % based on the resin. An amount less than 5 wt % cannot bring about the sufficient synergistic effect for improving the flame retardancy. An amount more than 40 wt %, on the other hand, causes the deterioration of physical properties. Because of these disadvantages, the amounts outside the above-mentioned range are not preferred practically.

In the resin, the phosphoruses may be present separately from the component of the modified resins, or a part or the entire part of the phosphoruses may form a salt with the modified resin. The inclusion of a salt, for example, in the form of a salt of phosphoric acid, a polyphosphoric acid, phosphorous acid, phosphonic acid, acidic ammonium polyphosphate, an acidic phosphate ester or an acidic phosphonate ester with the modified resin is preferred, because of the still better synergistic effect for the improvement of the flame retarciancy.

The modified resin of the present invention can further improve the flame retardancy of the resin, when incorporated together with a specific isocyanuric acids and/or cyanuric acids in the resin as a method for making the resin retardant to flame. This combination use is therefore preferred.

Examples of the specific isocyanuric acids and cyanuric acids include isocyanuric acids represented by the formula (3)

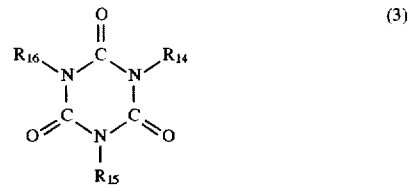

wherein $R_{14}$, $R_{15}$ and $R_{16}$ may be the same or different and they are individually a hydrogen atom or an alkyl group having 1 to 3 carbon atoms, an oxyalkyl group having 1 to 3 carbon atoms, a phenyl group or a glycidyl group, and cyanuric acids represented by the formula (4)

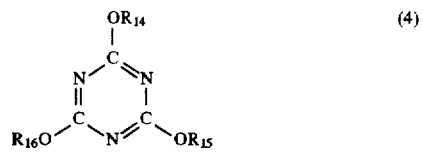

wherein $R_{14}$, $R_{15}$ and $R_{16}$ have the same meanings as defined in the formula (3).

The isocyanuric acids useful in the practice of the present invention are the compounds represented by the formula (3) in which $R_{14}$, $R_{15}$ and $R_{16}$ are the same or different and individually represent a substituent selected from the group consisting of a hydrogen atom, an alkyl group having 1 to 3 carbon atoms, an oxyalkyl group having 1 to 3, a phenyl group and a glycidyl group. Typical examples of such isocyanuric acids include, but are not limited to, isocyanuric acid, methyl isocyanurate, trimethyl isocyanurate, triethyl isocyanurate, tris(2-hydroxyethyl)isocyanurate, phenyl isocyanurate, diphenyl isocyanurate, triphenyl isocyanurate, dimethyl phenyl isocyanurate and triglycidyl isocyanurate.

The cyanuric acids useful in the practice of the present invention are compounds represented by the formula (4) in which $R_{14}$, $R_{15}$ and $R_{16}$ have the same meanings as defined in the formula (3). Typical examples of such cyanuric acids include, but are not limited to, cyanuric acid, methyl cyanurate, trimethyl cyanurate, triethyl cyanurate, tris(2-hydroxyethyl)cyanurate, phenyl cyanurate, diphenyl cyanurate, triphenyl cyanurate, dimethyl phenyl cyanurate and triglycidyl cyanurate.

In the present invention, the use ratio (an equivalent ratio to the triazine nucleus) of the sum of the isocyanuric acids and the cyanuric acids to the triazine nucleus equivalent in the modified resin can range from 0.01 are 5, preferably from 0.1 to 3. Use ratios less than 0.01 are too small to sufficiently bring about the effect of their combination use, whereas use ratios more than 5 lead to the deterioration of physical properties. The use ratios outside the above range are therefore not preferred from the practical viewpoint.

In the resin, such isocyanuric acids and cyanuric acids may present separately from the modified resin, or a part or the entire part of these acids may form salts and/or react with the modified resin and may hence be contained partially or entirely in the form of salts. Inclusion of a salt and/or product, for example, a salt of an isocyanuric acid with the modified resin and a reaction product of triglycidyl cyanurate with the modified resin can bring about the still better flame-retarding effect, heat resistance and the like and is hence preferred.

Useful examples of the above-mentioned salt include, but are not limited to, a salt obtained by dissolving or dispersing the isocyanuric acid and the modified resin in the presence or absence of a solvent and then heating the resulting solution to react them, a salt obtained by reacting the isocyanuric acid with the modified resin at a ratio of one to several equivalents of the isocyanuric acid to one equivalent of the triazine nucleus in the modified resin, and mixtures of the salts formed through these reactions.

The above-mentioned modified resin can further improve the flame retardancy of a resin, when employed in accordance with a flame-retarding method for the resin in which the modified resin is incorporated together with an amino-containing compound in the resin. This combination use of the modified resin with the amino-containing compound is therefore preferred.

The amino-containing compound has an aliphatic group, an alicyclic group, an aromatic group or a heterocyclic group having at least two carbons. Preferred are compounds containing an aliphatic group, an alicyclic group or a heterocyclic group having at least two carbons. More preferred are compounds which contain

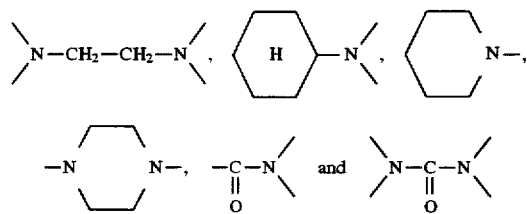

as well as dicyandiamide, guanidine and reaction products between these compounds and aldehydes such as formaldehyde or epoxy compounds.

Typical examples of such amino-containing compounds include, but are not limited to, 1,2-ethylenediamine, 1,3-diaminopropane, 1,2-diaminopropane, 1,4-butylenediamine, 1,6-hexamethylenediamine, polyalkylenepolyamines such as diethylenetriamine, triethylenetetramine, tetraethylenepentamine and pentaethylenehexamine, cyclohexylamine, cyclohexyldiamine, 1,3-bis(aminomethyl)cyclohexane, aniline, benzylamine, furfurylamine, N-(3-aminopropyl)morpholine, N-(2-aminoethyl)morpholine, N-(2-aminoethyl)-piperazine, N-(3-aminopropyl)piperazine, N-(2-aminoethyl)piperidine, N,N'-bis(2-aminoethyl)piperazine, dicyandiamide, guanidine, urea and polyamide resins and reaction products between these compounds and aldehydes such as formaldehyde, for example, ethylenediamine-formaldehyde (1/1) reaction product, piperazine-formaldehyde (1/1) reaction product, pentamethylene-hexamine and salts thereof.

In the present invention, the amino-containing compound can be used in an amount of 0.01 to 10 wt %, preferably 0.05 to 5 wt % based on the resin. Amounts less than 0.01 wt % cannot exhibit synergistic effect to sufficient extent for the improvement of the flame retardancy, whereas amounts more than 10 wt % lead to the deterioration of physical properties. Amounts outside the above range are therefore not preferred from the practical viewpoint.

In the flame-retarding method of the present invention for the resin, the thermal stability and the like of the resin can be improved by additionally incorporating additives such as a phenolic antioxidant, an amine-base antioxidant, a sulfur-containing antioxidant and a light stabilizer. These additives can be chosen as needed depending on the application purpose.

Examples of the above-mentioned phenolic antioxidant include known compounds, for example, monophenolic compounds such as 2,6-di-t-butyl-p-cresol, butylated hydroxyanisoles, 2,6-di-t-butyl-4-ethylphenol and octadecyl-3-(3,5-di-t-butyl-4-hydroxyphenyl)propionate, bisphenolic compounds such as 2,2'-methylene-bis-(4-methyl-6-t-butylphenol), 2,2'-methylene-bis-(4-ethyl-6-t-butylphenol), 4,4'-thiobis-(3-methyl-6-t-butylphenol) and 4,4'-butylidene-bis-(3-methyl-6-di-t-butylphenol), and high-molecular phenolic compounds such as 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis|methylene-3-(3',5'-di-t-butyl-4'-hydroxyphenyl)propionate|methane, bis|3,3'-bis(4'-hydroxy-3'-t-butylphenyl)butylic acid] glycol ester and the like. They can each be used in an amount of 0.001 to 2.0 wt %, preferably 0.05 to 1.0 wt % based on the resin.

Examples of the above-mentioned amine-base antioxidants include known compounds, for example, phenyl-l-naphthylamine, phenyl-2-naphthylamine, N,N'-diphenyl-p-phenylenediamine, 6-ethoxy-2,2,4-trimethyl-1,2-dihydroxyquinoline, dioctyliminodibenzyl, diethanolamine, triisopropanolamine, octadecyldiethanolamine, N,N'-diphenylethylenediamine, triethyltetramine, 4 mol ethylene oxide adduct of tridecylamine, 20 mol ethylene oxide adduct of hexadecylamine and the like. They can each be used in an amount of 0.02 to 5.0 wt % based on the resin.

Examples of the above-mentioned sulfur-containing antioxidants include known compounds, for example, dilauryl 3,3'-thio-di-propionate, dimyristyl 3,3'-thio-di-propionate, distearyl-3,3'-thio-di-propionate, 2-methylmercaptobenzoimidazole, pentaerythritol-tetrakis-(alauryl thiopropionate) and the like. They can each be used in an amount of 0.01 to 4.0 wt %, preferably 0.05 to 2.0 wt % based on the resin.

Examples of the above-mentioned light stabilizers include, but not limited to, known compounds, for example, benzophenone compounds, acetophenone compounds, benzotriazole compounds, benzoate compounds, oxalic anilide compounds, cyanoacrylate compounds, organic nickel compounds and hindered amine compounds. It is also possible to choose and use, as needed, one or more of the following additives: nucleating agents, for example, 4-t-butyl benzoate, adipic acid and diphenyl acetate; metal inactivating agents, for example, oxanilide, dicarboxylic dihydrazides and salicylic hydrazide; and free radical promoters, for example, 2,3-dimethyl-2,3-diphenylbutane (trade name "INTALOX CC DFB", made by Peroxyd Chemie GmbH), 3,4-dimethyl-3,4-diphenylhexane (trade name "INTALOX CC DFH", made by Peroxyd Chemie GmbH) and 2,3-dimethyl-2,3-diphenylhexane.

In the flame-retarding method of a resin regarding the present invention, no particular limitation is imposed on the manner of the production of the resin. It is possible to apply any production method which is generally employed in mixing powdery additives in the resin. In the case of a thermoplastic resin or the like, for example, the resin in the form of pellets or a powder is mixed in advance with the additives at ordinary temperature and the resulting mixture is molten, mixed and then molded by an extruder, a heating roll, a kneader or the like. As an alternative, a resin containing the additives at high concentrations is beforehand produced and is then molten and kneaded together with the usual resin, and the resulting mixture is thereafter molded. In the case of a thermosetting resin or the like, on the other hand, components essential to the present invention are added, before curing, to a monomer or prepolymer, or to a dope or compound which has been formed by adding a reinforcing material to the monomer or prepolymer. The resulting mixture is kneaded and then molded. It is however to be noted that the practice of the present invention should not be limited to these production methods.

In the flame-retarding method of a resin regarding the present invention, other additives can also be incorporated as needed to extent not impairing the advantageous effects of the present invention. Examples of these additives include plasticizers, dyes and pigments, dispersants, organic chelating agents, stabilizers, foaming agents, antihazing agents, delustering agents, surface treatments, fluorescent agents, mildewproofing agents, bacteriocides, antioxidants, ultraviolet light absorbers, known flame retardants or flame-retarding aids such as antimony trioxide, barium metaborate, zirconium dioxide, lead oxide, zinc borate, aluminum hydroxide, ammonium salts such as ammonium sulfate and ammonium carbonate, reaction products of cyanuric chloride and amines, and the triazine nucleus-containing compounds such as melamine derivatives, lubricants such as high fatty acids, higher fatty acid esters, higher fatty acid metal salts and bisamides, antistatic agents such as sulfonic acids, quaternary ammonium salts, polyhydric alcohol esters, alkylamides, alkylamines and electrically conductive carbon black, reinforcing materials such as glass fibers and carbon fibers, fillers such as talc, clay, calcined clay, mica, calcium silicate, calcium sulfate, calcium carbonate, glass beads, molybdenum disulfide and graphite, nucleating agents, processing aids, parting agents, and other polymers.

In the flame-retarding method of a resin regarding the present invention, it is preferred to additionally incorporate at least one selected from phosphoruses consisting of simple substances of phosphorus and phosphorus-containing compounds. Preferred phosphoruses are, for example, red phosphorus, phosphoric acid, polyphosphoric acids, phosphorous acid, phosphonic acid, phosphate salts, polyphosphate salts, phosphite salts, phosphonate salts, phosphate esters, phosphite esters, phosphonate esters, phosphines and sulfur-containing phosphorus compounds. Particularly preferred polyphosphate slats are ammonium polyphosphates represented by the following formula $(NH_4)_{m+2}P_mO_{3m+1}$ (wherein m is an integer more than 5). As an alternative, it is also preferred to additionally incorporate at least one component selected from the isocyanuric acids and cyanuric acids represented by the formula (3) and the formula (4), respectively.

As a further alternative, it is also preferred to additionally incorporate at least one component selected from amino-containing compounds. Preferred are, for example, compounds containing at least one group selected from

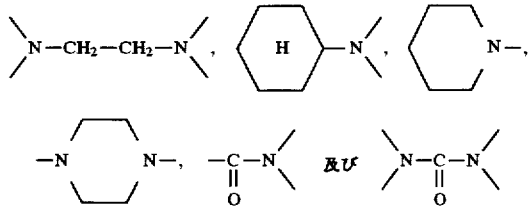

dicyandiamide, guanidine, and their reaction products with aldehydes or epoxy compounds.

It is particularly preferred to additionally incorporate the above-described phosphoruses and amino group-containing compound together as the flame-retarding aids.

The resins to which the flame-retarding method of the present invention can be applied are preferably a thermoplastic resin, a thermosetting resin and a thermoplastic elastomer. Preferable examples of the thermoplastic resin include polyolefin resins, polyamide resins, polystyrene resins, polyphenyleneether resins, polyacrylic resins, saturated polyester resins and polycarbonate resins. Preferable examples of the thermosetting resin include unsaturated polyester resins, diallyl phthalate resins, epoxy resins and urethane resins, and preferable examples of the thermoplastic elastomer include olefin thermoplastic elastomers.

Among the polyolefin resins, the polypropylene resins and polystyrene resins are extremely difficult to flame-retard, and so a conventional technique requires a large amount of an additive such as a triazine compound or a phosphorus compound to impart the flame retardancy thereto. However, because of the poor miscibility of the additive, the physical properties of the resulting resin product deteriorate noticeably. On the contrary, the employment of the modified resin regarding the present invention permits an aminotriazinyl group to be introduced and bonded to the resin, whereby the above-mentioned disadvantages can be overcome sufficiently. For these advantages, the flame-retarding method of the present invention is particularly useful to these polypropylene resins and polystyrene resins.

C. According to a thermal stabilization method of a resin regarding the present invention, at least one of the modified resins described in the above-mentioned paragraphs (b) to (d) and the epoxy-modified resin described in the above-mentioned paragraph (i) is incorporated in the resin. As a result, the heat stability, ultraviolet light resistance, long-term heat resistance and weathering resistance of the resin can be remarkably improved; the excellent molded article of the resin can be provided which scarcely brings about heat deterioration, coloring and color change at high-temperature working; and the aforesaid modified resin is excellent in high-temperature stability, non-volatility and handling properties and can sufficiently protect the resin from decomposition or deterioration by heavy metal ions such as copper ions. In consequence, an excellent method for modifying a resin can be provided.

Furthermore, the temperatures at which the weight of the resin is reduced 1% and 5% by heating can be remarkably improved, and hence high-temperature working can be easily done without any trouble, which permits various kinds of molding and working operations. For example, polyphenyleneether resins are excellent in thermal physical properties at high temperatures, but these resins give rise to decomposition and gelation at the time of the high-temperature molding and working, so that they are very poor in moldability. Therefore, they are blended with another resin such as a polystyrene resin to improve the moldability and workability, with the result that the excellent thermal characteristics which they originally have are impaired and in a certain case, these characteristics are not utilized at all. In the aforesaid modified resin regarding the present invention, the heat stability can be remarkably improved, and the molding and working at high-temperatures are possible, so that the other resin to be blended can be reduced or is not required any more. In consequence, inexpensive new materials having the excellent characteristics can be provided.

In the thermal stabilization method of a resin regarding the present invention, at least one of the aforesaid modified resins and epoxy-modified resin can be used in a suitable amount, and the modified resin may occupy a total portion or a partial portion of the resin. Practically, the modified resin is used in such an amount that the content of a triazine nucleus in the resin is in the range of from 0.01 to 10 wt %, preferably from 0.02 to 5 wt %. If the content of the triazine nucleus is less than 0.01 wt %, a sufficient stability improvement effect to heat, light and the like can scarcely be obtained, and on the other hand, if it is more than 10 wt %, the stability effect is not particularly improved any more, which is not preferable from an economical viewpoint.

The resins to which the thermal stabilization method of the present invention can be applied are substantially the same as the above-mentioned resins to which the flame-retarding method of the present invention is applicable. The thermal stabilization method of the resin regarding the present invention can enhance its stability improvement effect still further, when additives such as the above-described phenolic antioxidants, amine-base antioxidants, sulfur-containing antioxidants, light stabilizers, nucleating agents and other additives are additionally used in amounts similar to those specified above or the below-described phosphite antioxidants are used additionally. These additives can be chosen as needed depending on the application purpose.

Examples of the phosphite antioxidants include triphenyl phosphite, tris(nonylphenyl)phosphite, tris(2,4-di-t-butylphenyl)phosphite, diphenyl decyl phosphite, 2-ethylhexyl diphenyl phosphate, phenyl diisodecyl phosphite, diphenyl acid phosphate, tridecyl phosphate, tris(2-ethylhexyl)phosphite, tributyl phosphite, dilauryl acid phosphite, ditridecyl pentaerythritol diphosphite, distearyl pentaerythritol diphosphite, bis(2,4-di-t-butylphenyl) pentaerythritol diphosphite, bis(nonylphenyl)pentaerythritol diphosphite, diisodecyl pentaerythritol diphosphite, phenyl-4,4'-isopropylidenediphenol pentaerythritol diphosphite, trilauryl trithiophosphite, tris(lauryl-2-thioethyl)phosphite, diphenyl bis[4,4'-n-butylidenebis(2-t-butyl-5-methylphenol)]thiodiethanol diphosphite, bis(neopentylglycol)-1,4-cyclohexanedimethylene phosphite, hydrogenated 4,4'-isopropylidenediphenol polyphosphite, bis(octylphenyl)bis[4,4'-n-butylidenebis(2-t-butyl-5-methylphenol)]1,6-hexanediol diphosphite, tetratridecyl-4,4'-n-butylidenebis(2-t-butyl-5-methylphenol)diphosphite, tetratridecyl-1,1,3-tris(2'-methyl-5'-t-butyl-4'-oxyphenyl) butane diphosphite, tetra(C12-15 mixed alkyl)-4,4'-isopropylidenediphenyl diphosphite and the like. Preferably, these phosphite antioxidants can each be used in an amount of 0.01 to 10 wt % based on the resin.

In the thermal stabilization method for a resin regarding the present invention, the production of the resin and the use of other additives can be conducted in a similar manner to the above-described flame-retarding method of the resin but are not limited.

The resins to which the thermal stabilization method of the resin regarding the present invention can be applied are preferably thermoplastic resins, thermoplastic elastomers and synthetic waxes. More preferable is at least one selected from the group consisting of polyphenyleneether resins, polyacrylic resins, polystyrene resins, polyamide resins, polyolefin resins, olefin base thermoplastic elastomers and hydrocarbon base synthetic waxes. The preferable polyolefin resin is at least one selected from the group consisting of polyethylene resins, polypropylene resins and ethylene-propylene copolymers.

D. According to a compatibilizing method of resins regarding the present invention, at least one of the modified resin described in the above-mentioned paragraph (a) and the epoxy-modified resin described in the above-mentioned paragraph (i) is compatibilized with two other kinds of resins. As a result, the compatibility and dispersibility of the different kinds of resins can be remarkably improved, and a new material can be provided in which physical properties are improved; at the time of high-temperature working, the heat deterioration, coloring and color change of the resin can be inhibited, and the resulting material is excellent in high-temperature stability and non-volatility, can inhibit the generation of sublimation and bleeding, and is easy to handle and manufacture; even the compatibility and dispersibility between the resins having largely different solubility parameters can be improved, and therefore many kinds of resins are selectable and applicable, so that various kinds of new materials can be provided; since the molecular weight reduction and the quality change of the new material scarcely take place because of neither the decomposition nor gelation of the original resins, the characteristics of the resins can easily be maintained, so that the excellent new materials can easily be obtained; and the thermal stability of the material obtained by the compatibilization can also be improved. In consequence, the excellent modification method of a resin can be provided.

In the compatibilizing method of resins regarding the present invention, at least one of the aforesaid modified resin and epoxy-modified resin can be used in a suitable amount, and the modified resin may occupy a total portion or a partial portion of the corresponding resin. Usually, the modified resin is used in such an amount that the content of a reaction residue of the above-mentioned norbornenyl group-containing compound in the corresponding resin is in the range of from 0.1 to 30 wt %, but the amount of the modified resin can be suitably selected in accordance with the use purpose. If the content of the reaction residue is less than 0.1 wt %, a sufficient compatibilization effect can scarcely be obtained, and on the other hand, if it is more than 30 wt %, the compatibilization effect is not particularly improved any more, which is not preferable from an economical viewpoint. The epoxy-modified resin is used in such an amount that the content of a reaction residue of the above-mentioned epoxide in the corresponding resin is in the range of from 0.1 to 40 wt %, preferably from 0.5 to 30 wt %, but the amount of the epoxy-modified resin can be suitably selected in accordance with the use purpose. If the content of the reaction residue is less than 0.1 wt %, a sufficient compatibilization effect can scarcely be obtained, and on the other hand, if it is more than 40 wt %, the compatibilization effect is not particularly improved any more, and the characteristics of the resin easily deteriorate unpreferably.

As the compatibilizing methods of resins regarding the present invention, useful are a method which comprises incorporating at least one selected from the group consisting of the modified resin and the epoxy-modified resin into one or more other kinds of resins, and another method which comprises incorporating two or more different kinds of the modified resin and the epoxy-modified resin thereinto. These exemplified methods are not restrictive.

From the modified resins regarding the present invention, the materials having the various functional groups can be provided, and modification can further be enhanced by the use of these materials. Like the aforesaid modified resins, these materials can be used in the compatibilizing method regarding the present invention. The modified resins obtained by the use of the norbornenyl group-containing compound represented by the formula (2) are preferred, because they have an active amino group which is excellent in reactivity and can be further modified by a modification reaction with not only the above-mentioned epoxide but also a carboxylic acid (anhydride) of a maleic anhydride-modified polypropylene resin or the like, an isocyanate of a polyurethane resin or the like, an oxazoline of a styrene-2-vinyl-2-oxazoline copolymer or the like and an aldehyde of terephthalcarbaldehyde or the like. These materials are useful in the compatibilizing method regarding the present invention, similarly to the above-mentioned modified resins.

Resins to which the compatibilizing method of resins regarding the present invention can be applied are substantially the same as the resins applicable to the manufacturing method of the modified resins, but preferable examples of the resins include polyolefin resins, polyphenyleneether resins, saturated polyester resins, polyamide resins, polycarbonate resins, polystyrene resins and thermoplastic elastomers. Typical examples of the two or more different kinds of resins include, but are not limited to, different kinds of binary and multiple resins of polyolefin resins and polyamide resins, polyphenyleneether resins, polystyrene resins, polyimide resins and saturated polyester resins, different kinds of binary and multiple resins of polyphenyleneether resins and polyamide resins, polyimide resins, polyaramid resins and saturated polyester resins, different kinds of binary and multiple resins of elastomers and polyolefin resins, polyamide resins, polyphenyleneether resins, polystyrene resins, polyimide resins and saturated polyester resins, and different kinds of binary and multiple resins of saturated polyester resins and other resins.

As the useful compatibilizing methods of resins regarding the present invention, there are a method which comprises simultaneously carrying out the manufacturing process of the aforesaid modified resin or epoxy-modified resin and the compatibilizing process of different kinds of resins, and a method which comprises first obtaining the aforesaid modified resin or epoxy-modified resin, and then compatibilizing different kinds of resins by the use of the obtained modified resin or epoxy-modified resin. A suitable method can be selected from these methods in compliance with a use purpose, but these methods are not restrictive.

No particular restriction is put on a method for preparing the material and usually, there can be applied a solution method, a latex method and a melting method which can be used in the compatibilizing method of the resins. For example, the pellets or powder of the resin is first mixed at ordinary temperature, and then molten, mixed and molded by the use of a machine for kneading such as a single screw extruder, a twin-screw extruder, heating rolls, a Bumbury's mixer and a kneader. This method is not restrictive.

In the compatibilizing method of resins regarding the present invention, some additives can be used in the same amounts as described above in connection of the above-mentioned method, and examples of the additives include phenolic antioxidants, amine-base antioxidants, sulfur-containing antioxidants, phosphite-containing antioxidants, light stabilizers, nucleating agents and other additives. These additives can be chosen as needed depending on an application purpose.

E. In a surface modification method of resins regarding the present invention, at least one resin of the modified resins described in the above-mentioned paragraphs (b) to (d) and the epoxy-modified resin described in the above-mentioned paragraph (i) is used. As a result, wettability, adhesive properties, coating properties, dyeability, water/oil repellency, solvent resistance and the like of the resin can be improved; since the high-molecular weight resin itself is modified and denatured instead of adding a low-molecular weight additive, the modified resin is excellent in high-temperature stability and non-volatility, and the diminution of the effect due to the loss of a modifier with time or by heat or the like does not take place; the separation and loss of the modifier by poor compatibility with the resin scarcely occur; and the wettability on the surface of the resin can be selected in compliance with a use purpose. In consequence, an excellent surface modification method of a resin can be provided.

The surface modification method of a resin regarding the present invention is particularly useful for polyolefin resins such as polypropylene resins in which surface properties such as adhesive properties, coating properties and dyeability are noticeably limited. These resins have excellent physical properties and characteristics, but their applications are severely limited, because of having these serious faults. By virtue of this surface modification method, however, these faults can be eliminated, so that the development of these resins is widely possible in many applications.

In addition, polypropylene fibers have excellent features such as being light, strong, warm and easily dryable, but on the other hand, they have a serious defect of the surface properties that dyeability is noticeably poor. For this reason, the applications of the polypropylene fibers are noticeably limited.

As techniques for improving the dyeability, many suggestions have been made which comprise, for example, adding a modifier or utilizing a maleic acid-modified polypropylene fiber. However, these suggested methods are some disadvantages. For example, the sufficient dyeability is not obtained; the dispersion and compatibility of the modifier are insufficient; heat resistance noticeably deteriorates; and weathering resistance is poor.

According to the surface modification method of a resin regarding the present invention, the functional group for remarkably improving the dyeability can be bonded and introduced to the resin as much as required, and thus most satisfactorily improving dyeability can be imparted by the modification. For example, the dyeability is excellent; any anxiety about dispersion and compatibility is not present; heat resistance and weathering resistance are excellent; and quality change and heat deterioration of the obtained resin by the molecular weight reduction and the like can be sufficiently inhibited.

The manufacture and dyeing method of the modified fibers can be carried out by the use of a known spinning procedure, a known dye, known dyeing conditions and known soaping procedure and the like. Since an aminotriazinyl group is introduced and bonded to the thus modified fiber, a dye such as an acid dyeing is advantageous, which is not restrictive.

According to the surface modification method of a resin regarding the present invention, on the surface of the resin provided from the modified resin obtained by the use of the norbornenyl group-containing compound represented by the formula (2), an active amino group having an excellent activity is present in large quantities. Therefore, this resin surface may be treated with an aldehyde, an epoxide, a carboxylic acid (anhydride), an isocyanate, an oxazoline, silanes such as a chlorosilane and an alkoxysilane, a silazane or a silane such as a specific silyl agent, silane coupling agents such as a vinylsilane, an epoxysilane and a fluorine-containing silane to further modify the surface. This method is also very useful.

According to the present invention, there can be provided a coating resin composition having good coating properties which comprises using at least one resin selected from the group consisting of the modified resins described in the above-mentioned paragraphs (b) to (d) and the epoxy-modified resin described in the above-mentioned paragraph (i). Since the coating resin composition contains a segment having a good compatibility with resins, the composition is excellent in adhesive properties to a material, and it is also excellent in solvent resistance, water resistance and coating properties. Furthermore, according to the present invention, there can be provided an adhesive resin composition having good adhesive properties which comprises using at least one resin selected from the group consisting of the modified resins described in the above-mentioned paragraphs (b) to (d) and the epoxy-modified resin described in the above-mentioned paragraph (i). Since the adhesive resin composition contains a segment having a good compatibility with a resin and a segment having good adhesive properties to another base material, the composition is excellent in adhesive properties to the material. The composition can also be used together with various materials to provide a composite material.

In the surface modification method of a resin regarding the present invention, with regard to the amount of the modified resin or the epoxy-modified resin to be used, this modified resin may occupy a total portion or a partial portion of the resin. The modified resin and the epoxy-modified resin can be effectively used singly or in a combination. The employment of the epoxy-modified resin is particularly preferable, because the adhesive properties to a desired material can be suitably selected in compliance with a use purpose to accomplish the excellent surface modification. For example, for a resin such as a polyolefin resin or a polystyrene resin, the resin is usually used together with a rubber such as an olefin base thermoplastic elastomer so as to improve physical properties. However, when the modification of surface properties such as wettability, adhesive properties and coating properties is intended, both or either of the modified resin and the modified rubber can be used in such an amount as to occupy a total portion or a partial portion of the resin, thereby modifying the surface characteristics. These conditions can be suitably selected in compliance with a use purpose.

The modified resin is used in such an amount that the content of a reaction residue of the above-mentioned norbornenyl group-containing compound in the corresponding resin is in the range of from 0.1 to 30 wt %, but the amount of the modified resin can be suitably selected in accordance with the use purpose. If the content of the reaction residue is less than 0.1 wt %, a sufficient surface modification effect can scarcely be obtained, and on the other hand, if it is more than 30 wt %, the modification effect is not particularly improved any more and the characteristics of the resin deteriorate, which is not preferable from an economical viewpoint.

Furthermore, the epoxy-modified resin is used in such an amount that the content of a reaction residue of the above-mentioned epoxide in the corresponding resin is in the range of from 0.1 to 30 wt %, but the amount of the modified resin can be suitably selected in accordance with the use purpose. If the content of the reaction residue is less than 0.1 wt %, a sufficient surface modification effect can scarcely be obtained, and on the other hand, if it is more than 30 wt %, the characteristics of the resin easily deteriorate, which is not preferable.

In the surface modification method of a resin regarding the present invention, the production of the resin and the use of other additives can be conducted in a similar manner to the above-described flame-retarding method of a resin but are not limited.

In the above-mentioned coating resin composition, the amount of the modified resin or the epoxy-modified resin may occupy a total portion or a partial portion of the resin composition. The modified resin and the epoxy-modified resin can be effectively used singly or in a combination, but the employment of the epoxy-modified resin is particularly preferable, because the epoxy-modified resin is very excellent in adhesive properties to the various resins, solvent resistance, water resistance and the like. Moreover, the epoxy-modified resin obtained by using bisphenol A, bisphenol F or a compound having a naphthalene skeleton as the epoxide is preferable.

In the above-mentioned adhesive resin composition, the amount of the modified resin or the epoxy-modified resin may occupy a total portion or a partial portion of the resin composition. The modified resin and the epoxy-modified resin can be effectively used singly or in a combination, but the employment of the epoxy-modified resin is particularly preferable, because the epoxy-modified resin is very excellent in adhesive properties to the various resins. Moreover, the epoxy-modified resin obtained by using bisphenol A, bisphenol F or a compound having a naphthalene skeleton as the epoxide is particularly preferable, because of being excellent in adhesive properties to various materials.

The adhesive resin composition may be in either state of a solvent type, a non-solvent type or a solid melting use type such as a hot-melt type adhesive and a room temperature fluid type such as a tackifying adhesive, and the desired type of the adhesive resin composition can be suitably selected in compliance with a use purpose.

A manufacturing method of the aforesaid modified resin and the like regarding the present invention as well as its utilization lead to the following functional effects.

The method for preparing the aforesaid modified resin regarding the present invention can be accomplished by reacting the above-mentioned norbornenyl group-containing compound with a resin under specific conditions. According to this preparation method, the modification can be done without impairing the molecular weight, physical properties and the like of the resin, and there can be bonded and introduced, to the resin, a functional group effective to improve the properties such as flame retardancy, thermal stability, heat resistance, compatibility, surface properties such as wettability, adhesive properties, coating properties and dyeability, moldability, electrical properties, gloss and the like. Furthermore, a method for preparing the aforesaid epoxy-modified resin of the present invention can be accomplished by reacting the aforesaid specific modified resin and an epoxide under specific conditions. This preparation method can be easily carried out, and the modification can be sufficiently done to remarkably improve surface properties such as wettability, coating properties, adhesive properties and dyeability, moldability, electrical properties and the like of the resin. In addition, the aforesaid modified resin and epoxy-modified resin can be utilized to further improve the compatibility and dispersibility between different kinds of resins. For these advantages, the methods for preparing the aforesaid modified resin and epoxy-modified resin can be widely developed in many applications, and hence it is fair to say that these methods can be industrially very useful.

According to the flame-retarding method of a resin regarding the present invention, the flame retardancy of the resin can be remarkably improved by using the aforesaid modified resin or epoxy-modified resin obtained by the use of the norbornenyl group-containing compound represented by the formula (2), its condensate or its etherified condensate. In contrast to a method which comprises adding a flame-retardant such as melamine, the method of the present invention can inhibit the generation of sublimation, bleeding and the like, and since a flame retardancy-imparting component is bonded and introduced to the resin, the loss of the component with time and a dispersion failure such as bleeding scarcely occur. Therefore, the effect of the component can be maintained for a long time, whereby the flame retardancy of the obtained resin can be remarkably improved. The characteristics and physical properties of the original resin are not impaired, and the char formability and the like of the obtained resin are extremely good, so that the sagging or dripping of oil droplets or a melt can be remarkably decreased. In addition, an extremely noxious gas is not given off during burning. It is apparent from the foregoing that the flame retardancy improvement effect of the obtained resin is excellent. When the aforesaid modified resin is used together with phosphoruses, an isocyanuric acid, a cyanuric acid or an amino group-containing compound, a synergistic effect can be obtained to further improve the flame retardancy. For these advantages, the obtained resins can be widely developed in many applications, and the present invention can be considered to be industrially very useful.

The thermal stabilization method of a resin regarding the present invention can be accomplished by the use of the aforesaid modified resin or epoxy-modified resin which can be obtained by employing the norbornenyl group-containing compound of the formula (2), its condensate or its etherified condensate. In the thus thermally stabilized resin, ultraviolet light resistance, heat stability, heat resistance and the like can be remarkably improved, and even when molding is made at a high temperature, heat deterioration, coloring and color change can be inhibited, which means that the stabilized resin is improved in heat stability and heat resistance. Even when used at a relatively high temperature for a long period of time, the resin scarcely deteriorates, so that its physical properties can be maintained very satisfactorily. Since the thermal stability-imparting component is bonded and introduced to the resin, the loss of the component with time and a dispersion failure such as bleeding scarcely occur, so that the effect of the component can be maintained for a long time and thus a stability effect to heat, light and the like is also sufficient and it can be exerted for a long time without inducing any secondary troubles. In addition, the stabilized resin can sufficiently protected from decomposition or deterioration by heavy metal ions such as copper ions, and since thermal stability and heat resistance can be remarkably improved, the high-temperature molding and working of the resin can be very easily accomplished. Thus, the resin thermally stabilized by the method of the present invention is extremely excellent in thermal stabilization improvement effect, and so the method permits the offer of new materials having such excellent characteristics as described above. For these advantages, the thermally stabilized resins can be widely developed in many applications, and the method of the present invention can be considered to be industrially very useful.

The compatibilizing method of resins regarding the present invention can be accomplished by using the aforesaid modified resin or epoxy-modified resin together with two or more different kinds of resins. In the thus compatibilized resins, the compatibility and dispersion of the different kinds of resins can be remarkably improved, and this method permits the offer of new materials to which new characteristics such as impact resistance, stiffness, flame retardancy, heat resistance, chemical resistance, barrier properties, pearl gloss, moldability/workability, adhesive properties and coating properties can be imparted. Furthermore, in the compatibilized resins, coloring and color change at high-temperature working can be inhibited, and these resins are also excellent in high-temperature stability and non-volatility. The compatibilized resins can inhibit the generation of sublimation, bleeding and the like, and they are also excellent in adhesive properties, electrical properties and the like and their handling and manufacturing are easy. According to the present invention, even the compatibility and dispersibility between the resins having largely different solubility parameters can be improved, and therefore many kinds of resins are selectable and applicable. In the compatibilized resins, their molecular weight reduction, quality change and the like, which are caused by the decomposition or the like of the original resins, scarcely occur, so that the characteristics of the compatibilized resins can be easily maintained. The aforesaid modified resin or epoxy-modified resin can also be obtained from the different kinds of resins themselves to be compatibilized, and in this case, a third component such as a low-molecular weight compound for the compatibilization is not required, so that excellent new materials can be provided. In addition, this modified resin or epoxy-modified resin functions to improve thermal stability, water resistance and chemical resistance in the compatibilized resins. For these advantages, the compatibilized resins can be widely developed in many applications, and the method of the present invention can be considered to be industrially very useful.

The surface modification method of a resin regarding the present invention can be accomplished by using the aforesaid modified resin or epoxy-modified resin. In the thus surface modification resin, surface properties such as wettability, adhesive properties, coating properties, dyeability and water/oil repellency can be remarkably improved, and since any third component such as a surface modifier is not required, the decrease of the effect due to the loss of the surface modification-imparting component does not occurs any more, so that the physical properties of the resin do not lower, either. It is not necessary to carry out the surface modification after molding or the like, and therefore the good and uniform surface modification can be done for molded articles having various shapes. In particular, according to another excellent feature of the present invention, the functional group of the aforesaid modified resin or epoxy-modified resin can be bonded and introduced to polyolefin resins and the like which can scarcely accept surface properties such as adhesive properties, coating properties and dyeability, whereby the surface properties of these kinds of resins and their fibers can be remarkably improved.

Moreover, the present invention can provide a coating resin composition and a adhesive resin composition obtained by the use of the aforesaid modified resin or epoxy-modified resin. The coating resin composition is excellent in adhesive properties to a resin, solvent resistance, water resistance and the like, and the adhesive resin composition contains a segment having a good compatibility with a resin and a segment having good adhesive properties to another base material, and hence the adhesive resin composition is excellent in adhesive properties to various materials. Thus, according to this invention, new materials can be provided. For these advantages, the above-mentioned compositions can be widely developed in many applications, and the method of the present invention can be considered to be industrially very useful.

Next, the present invention will be described in more detail with reference to reference examples and examples. However, the scope of the present invention should not be limited by these reference examples and examples at all.

REFERENCE EXAMPLE 1

Preparation of norbornenecarboguanamine-formaldehyde condensate:

243.2 g (3.0 mols) of a 37% formalin was added to 203.0 g (1 mol) of 2-(4,6-diamino-1,3,5-triazin-2-yl)bicyclo[2.2.1] hept-5-ene (hereinafter abbreviated to "norbornenecarboguanamine"), and the mixture was then adjusted to pH 10.5 with a 20% aqueous potassium hydroxide solution under mixing and stirring. Next, this mixture was heated at a temperature of 70° C. for 1 hour under stirring. After the completion of the heating, a 20% aqueous nitric acid solution was added to this reaction mixture to adjust the same to pH 2.0. Furthermore, this reaction mixture was heated at a temperature of 70° C. under stirring to slowly become turbid, and this heating was continued for 3 hours to carry out reaction. After the completion of the heating, this reaction mixture was adjusted to pH 8.0 with a 20% aqueous potassium hydroxide solution, and the resulting precipitate was then collected by filtration. The collected precipitate was sufficiently washed with distilled water, and then dried under reduced pressure to obtain a white solid. As a result of the analysis of the solid, it was apparent that the solid was a condensate having an average addition condensation degree of 3.8.

REFERENCE EXAMPLE 2

Preparation of norbornenecarboguariamine-formaldehyde condensate:

243.2 g (3.0 mols) of a 37% formalin was added to 203.0 g (1 mol) of norbornenecarboguanalmine, and the mixture was then adjusted to pH 10.5 with a 20% aqueous potassium hydroxide solution under mixing and stirring. Next, this mixture was heated at a temperature of 70° C. for 30 minutes under stirring. After the completion of the heating, a 20% aqueous nitric acid solution was added to this reaction mixture to adjust the same to pH 4.0. Furthermore, this reaction mixture was heated at a temperature of 60° C. under stirring to slowly become turbid, and this heating was continued for 1 hour to carry out reaction. After the completion of the heating, this reaction mixture was adjusted to pH 7.0 with a 20% aqueous potassium hydroxide solution. Next, 200 g of benzene was added to the reaction mixture, followed by heating to remove benzene. Afterward, the resulting precipitate was then collected by filtration. The collected precipitate was sufficiently washed with distilled water, and then dried under reduced pressure to obtain a white solid. As a result of the analysis of the solid, it was apparent that the solid was a condensate having an average addition condensation degree of 1.6.

REFERENCE EXAMPLE 3

Preparation of etherified condensate of norbornenecarboguanamine:

131.3 g (3.5 mols) of paraformaldehyde (80%) and 500 ml of n-butanol were added to 203.0 g (1 mol) of norbornenecarboguanamine, and the mixture was then adjusted to pH 11.0 with a 20% aqueous potassium hydroxide solution under mixing and stirring. Afterward, this mixture was heated at a temperature of 60° C. for 30 minutes under stirring, and a 20% aqueous nitric acid solution was then added to the mixture to adjust the same to pH 3.0. Furthermore, the resulting reaction mixture was heated for 3 hours under stirring, while reflux dehydration was carried out under reflux temperature conditions. After the completion of the heating, a 20% aqueous potassium hydroxide was added to this reaction mixture to adjust the same to pH 8.0, and the resulting precipitate was then removed by filtration. Next, the solvent was removed from the solution to obtain a resinous product. As a result of analysis, it was apparent that the product was an etherified condensate containing a butyl ether group and having an average addition condensation degree of 2.3.

REFERENCE EXAMPLE 4

Preparation of epoxidized polyphenyleneether resin:

In a 2-liter autoclave equipped with a stirrer and an inlet were placed 20 g of a polyphenyleneether resin (number-average molecular weight=21,000) and 1 liter of epichlorohydrin, and the autoclave was then purged with nitrogen. Afterward, the mixture was slowly heated up to 100° C., and the resin was dissolved by stirring, while the temperature in the autoclave was maintained at 100° C. Next, 5 cc of a 10% aqueous sodium hydroxide solution was added to the solution, and reaction was then carried out at an inside temperature of 100° C. for 5 hours. After the completion of the reaction, remaining epichlorohydrin was distilled off under reduced pressure, and chloroform was added to the resulting solid to dissolve it. From the solution, insolubles were removed by filtration, and a methanol-water mixed solvent was then added to the solution. Next, the deposited precipitate was collected by filtration, sufficiently washed with the above-mentioned mixed solvent, and then dried under reduced pressure to obtain an epoxidized polyphenyleneether resin. As a result of analysis of the resin, it was apparent that the resin had an epoxy equivalent of 24,000.

EXAMPLE 1

Preparation of modified polypropylene resin:

100 parts by weight of a polypropylene resin (trade name Mitsui NOBLEN JS-G, made by Mitsui Toatsu Chemicals Inc.) was sufficiently mixed with 10 parts by weight of norbornenecarboguanamine and 0.1 part by weight of dilauryl thiodipropionate by a Henschel mixer. Afterward, the mixture was fed to a twin-screw extruder equipped with a 20-mm vent sealed with nitrogen, and kneading and reaction were then carried out under such conditions that the mixture was allowed to reside at 260° C. for 10 minutes, followed by pelletizing.

The resulting pellets were dissolved in hot xylol, and the solution was then filtered through a membrane filter (pore diameter=1.0 μm). To the filtrate, methyl cellosolve was poured, and the deposited precipitate was collected by filtration, sufficiently washed with methyl cellosolve, and then dried under reduced pressure to obtain a white solid. As a result of the analysis of this solid, it was apparent that the solid was a modified polypropylene resin to which 4.9 wt % of a 4,6-diamino-1,3,5-triazine skeleton was bonded. The results of the elemental analysis and infrared absorption spectrum analysis of this solid were as follows.

|        | Elemental analysis | | |
|--------|-------|-------|------|
|        | C     | H     | N    |
| Found: | 83.1% | 13.8% | 3.1% |

Infrared absorption spectrum analysis
$NH_2$-based absorption 3320, 3150 $cm^{-1}$
$C=N$-based absorption 1630, 1550 $cm^{-1}$
Triazine ring-based absorption 815 $cm^{-1}$

EXAMPLE 2

Preparation of modified polypropylene resin:

Kneading and reaction were carried out by the same procedure as in Example 1 except that 10 parts by weight of norbornenecarboguanamine in Example 1 was replaced with 25 parts by weight of the same compound, followed by pelletizing.

The pellets were treated with a solvent in the same manner as in Example 1. The resulting solid was dried under reduced pressure, and then subjected to analysis. As a result, it was apparent that the solid was a modified polypropylene resin to which 10.9 wt % of a 4,6-diamino-1,3,5-triazine skeleton was bonded. The results of the elemental analysis of this solid were as follows.

Furthermore, the measured MI value of the pellets of this solid was 1.8. On the other hand, as a comparative example, a solid was obtained by similarly kneading the above-mentioned polypropylene resin alone, and its MI value was 2.3. The preparation method of the present invention was so excellent that the molecular weight reduction, color change and the like of the resin were scarcely brought about.

|  | Elemental analysis | | |
|---|---|---|---|
|  | C | H | N |
| Found: | 80.1% | 13.0% | 6.9% |

EXAMPLE 3

Preparation of modified polypropylene resin:

Kneading and reaction were carried out by the same procedure as in Example 1 except that a polypropylene resin (trade name Mitsui NOBLEN JS-G, made by Mitsui Toatsu Chemicals Inc.) in Example 1 was replaced with a polypropylene resin having a low polymerization degree of MI value=100, followed by pelletizing.

The pellets were treated with a solvent in the same manner as in Example 1. The resulting solid was dried under reduced pressure, and then subjected to analysis. As a result, it was apparent that the solid was a modified polypropylene resin to which 4.9 wt % of a 4,6-diamino-1,3,5-triazine skeleton was bonded. The results of the elemental analysis of this solid were as follows.

|  | Elemental analysis | | |
|---|---|---|---|
|  | C | H | N |
| Found: | 83.2% | 13.7% | 3.1% |

COMPARATIVE EXAMPLE 1

Modification test of polypropylene resin:

Kneading and reaction were carried out by the same procedure as in Example 1 except that 10 parts by weight of norbornenecarboguanamine in Example 1 was replaced with 10 parts by weight of 2-(4,6-diamino-1,3,5-triazin-2-yl)bicyclo[2.2.1]heptane, followed by pelletizing.

The pellets were treated with a solvent in the same manner as in Example 1. The resulting solid was dried under reduced pressure, and afterward, for the solid, elemental analysis and infrared absorption spectrum analysis were made. As a result, it was apparent that the presence and bond of a 4,6-diamino-1,3,5-triazine skeleton were not confirmed as in the raw material polypropylene resin, which meant that the raw material polypropylene resin was not modified. The results of the elemental analysis of this solid were as follows.

| Elemental analysis | | | |
|---|---|---|---|
|  | C | H | N |
| Found: | 85.6% | 14.4% | 0.0% |

COMPARATIVE EXAMPLE 2

Modification test of polypropylene resin:

100 parts by weight of a polypropylene resin (trade name Mitsui NOBLEN JS-G, made by Mitsui Toatsu Chemicals Inc.) was sufficiently mixed with 10 parts by weight of 5-norbornene-2,3-dicarboxylic anhydride and 0.1 part by weight of dilauryl thiodipropionate by a Henschel mixer. Afterward, the mixture was fed to a twin-screw extruder equipped with a 20-mm vent sealed with nitrogen, and kneading and reaction were then carried out under such conditions that the mixture was allowed to reside at 240° C. for 10 minutes, followed by pelletizing.

The resulting pellets were dissolved in hot xylol, and the solution was then filtered through a membrane filter (pore diameter=1.0 μm). To the filtrate, methanol was poured, and the deposited precipitate was collected by filtration, sufficiently washed wish methanol, and then dried under reduced pressure to obtain a white solid. As a result of the infrared absorption spectrum analysis of this solid, it was apparent that neither carboxylic acid-based absorption nor carboxylic anhydride-based absorption (at 1710, 1770, 1785, 1860 cm$^{-1}$ and the like) were confirmed, which meant that the polypropylene resin was not modified at all.

Furthermore, kneading, reaction, treatment and analysis were carried out by the same procedure as described above except that a kneading temperature of 240° C. was replaced with a kneading temperature of 260° C. or 280° C. As a result, it was apparent that even under these kneading conditions, the polypropylene resin was not modified at all.

COMPARATIVE EXAMPLE 3

Modification test of polypropylene resin:

Kneading and reaction were carried out by the same procedure as in Comparative Example 2 except that 10 parts by weight of 5-norbornene-2,3-dicarboxylic anhydride in Comparative Example 2 was replaced with 10 parts by weight of maleic anhydride, followed by pelletizing.

The pellets were treated in the same manner as in Comparative Example 2 to obtain a white solid. For this solid, infrared absorption spectrum analysis was made. As a result, it was apparent that neither carboxylic acid-based absorption nor carboxylic anhydride-based absorption (at 1710, 1770, 1785, 1860 cm$^{-1}$ and the like) were confirmed, which meant that the polypropylene resin was not modified at all.

EXAMPLE 4

Preparation of modified polyethylene resin:

Kneading and reaction were carried out by the same procedure as in Example 1 except that a polypropylene resin (trade name Mitsui NOBLEN JS-G, made by Mitsui Toatsu Chemicals Inc.) in Example 2 was replaced with a polyethylene resin (trade name HIZEX 6200BP, made by Mitsui Petrochemical Industries, Ltd.), followed by pelletizing.

The pellets were treated with a solvent in the same manner as in Example 1. The resulting solid was dried under reduced pressure, and afterward, for the solid, elemental analysis and infrared absorption spectrum analysis were made. As a result, it was apparent that the solid was a modified polyethylene resin to which 11.3 wt % of a 4,6-diamino-1,3,5- triazine skeleton was bonded. The results of the elemental analysis of this solid were as follows.

| | Elemental analysis | | |
|---|---|---|---|
| | C | H | N |
| Found: | 79.8% | 13.0% | 7.2% |

EXAMPLE 5

Preparation of modified polyphenyleneether resin:

100 parts by weight of poly(2,6-dimethyl-1,4-phenyleneether) having an intrinsic viscosity [η] of 0.42 was sufficiently mixed with 10 parts by weight of norbornenecarboguanamine and 0.1 part by weight of dilauryl thiodipropionate by a Henschel mixer. Afterward, the mixture was fed to a twin-screw extruder equipped with a 20-mm vent sealed with nitrogen, and kneading and reaction were then carried out under such conditions that the mixture was allowed to reside at 310° C. for 10 minutes, followed by pelletizing.

The resulting pellets were dissolved in chloroform, and the solution was then filtered through a membrane filter (pore diameter=1.0 μm). To the filtrate, methyl cellosolve was poured, and the deposited precipitate was collected by filtration, sufficiently washed with methyl cellosolve, and then dried under reduced pressure to obtain a yellow solid. As a result of the analysis of this solid, it was apparent that the solid was a modified polyphenyleneether resin (a nitrogen content in the unmodified resin was 0.1 wt %) to which 4.9 wt % of a 4,6-diamino-1,3,5-triazine skeleton was bonded. The results of the elemental analysis of this solid were as follows.

Furthermore, the molecular weight of the pellets was measured by GPC, and as a result, it was apparent that the molecular weight was about the same as that of the raw material polyphenyleneether resin before the above-mentioned kneading and reaction. Thus, the preparation method of the present invention was so excellent that the molecular weight change, color change and the like of the resin were scarcely brought about.

| | Elemental analysis | | |
|---|---|---|---|
| | C | H | N |
| Found: | 77.8% | 6.6% | 3.2% |

EXAMPLE 6

Preparation of modified polystylene resin:

100 parts by weight of a polystylene resin (trade name TOPOLEX 570-2, made by Mitsui Toatsu Chemicals, Inc.) was sufficiently mixed with 5 parts by weight of norbornenecarboguanamine and 0.1 part by weight of tris(2-methyl-4-hydroxy-5-t-butylphenyl)butane by a Henschel mixer. Afterward, the mixture was fed to a twin-screw extruder equipped with a 20-mm vent sealed with nitrogen, and kneading and reaction were then carried out under such conditions that the mixture was allowed to reside at 250° C. for 15 minutes, followed by pelletizing.

The resulting pellets were dissolved in chloroform, and the solution was then filtered through a membrane filter (pore diameter=1.0 μm). To the filtrate, methyl cellosolve was poured, and the deposited precipitate was collected by filtration, sufficiently washed with methyl cellosolve, and then dried under reduced pressure to obtain a white solid. As a result of the analysis of this solid, it was apparent that the solid was a modified polystylene resin to which 2.5 wt % of a 4,6-diamino-1,3,5-triazine skeleton was bonded. The results of the elemental analysis and infrared absorption spectrum analysis of this solid were as follows.

| | Elemental analysis | | |
|---|---|---|---|
| | C | H | N |
| Found: | 90.7% | 7.7% | 1.6% |

Infrared absorption spectrum analysis
$NH_2$-based absorption 3310, 3160 $cm^{-1}$
C=N-based absorption 1630, 1550 $cm^{-1}$
Triazine ring-based absorption 818 $cm^{-1}$

EXAMPLE 7

Preparation of modified saturated polyester resin:

100 parts by weight of a saturated polyester resin (trade name Teijin PBT Resin TRB-H, made by Teijin Limited) was sufficiently mixed with 10 parts by weight of norbornenecarboguanamine and 0.1 part by weight of tris(2-methyl-4-hydroxy-5-t-butylphenyl)butane by a Henschel mixer. Afterward, the mixture was fed to a twin-screw extruder equipped with a 20-mm vent sealed with nitrogen, and kneading and reaction were then carried out under such conditions that the mixture was allowed to reside at 260° C. for 15 minutes, followed by pelletizing.

The resulting pellets were dissolved in dichloroethane, and the solution was then filtered through a membrane filter (pore diameter=1.0 μm). To the filtrate, methyl cellosolve was poured, and the deposited precipitate was collected by filtration, sufficiently washed with methyl cellosolve, and then dried under reduced pressure to obtain a white solid. As a result of the analysis of this solid, it was apparent that the solid was a modified saturated polyester resin to which 4.3 wt % of a 4,6-diamino-1,3,5-triazine skeleton was bonded. The results of the elemental analysis and infrared absorption spectrum analysis of this solid were as follows.

| | Elemental analysis | | |
|---|---|---|---|
| | C | H | N |
| Found: | 64.5% | 5.5% | 2.7% |

Infrared absorption spectrum analysis
$NH_2$-based absorption 3320, 3160 $cm^{-1}$
C=N-based absorption 1630, 1550 $cm^{-1}$
Triazine ring-based absorption 816 $cm^{-1}$

EXAMPLE 8

Preparation of modified polyamide resin:

100 parts by weight of a polyamide resin (trade name Toyobo Nylon T-802, made by Toyobo Co., Ltd.) was sufficiently mixed with 10 parts by weight of norbornenecarboguanamine by a Henschel mixer. Afterward, the mixture was fed to a twin-screw extruder equipped with a 20-mm vent sealed with nitrogen, and kneading and reaction were then carried out under such conditions that the mixture was allowed to reside at 250° C. for 15 minutes, followed by pelletizing.

The resulting pellets were dissolved in m-cresol, and the solution was then filtered through a membrane filter (pore diameter=1.0 μm). To the filtrate, methyl cellosolve was poured, and the deposited precipitate was collected by filtration, sufficiently washed with methyl cellosolve, and then dried under reduced pressure to obtain a white solid. As a result of the analysis of this solid, it was apparent that the solid was a modified polyamide resin to which 4.8 wt % of a 4,6-diamino-1,3,5-triazine skeleton was bonded. The results of the elemental analysis of this solid were as follows.

|  | Elemental analysis | | |
| --- | --- | --- | --- |
|  | C | H | N |
| Found: | 62.5% | 9.5% | 14.7% |

EXAMPLE 9

Preparation of modified polymethacrylic resin:

100 parts by weight of a polymethacrylic resin (trade name Parapet HR, made by Kyowa Gas Chemical Indutries Inc.) was sufficiently mixed with 10 parts by weight of norbornenecarboguanamine by a Henschel mixer. Afterward, the mixture was fed to a twin-screw extruder equipped with a 20-mm vent sealed with nitrogen, and kneading and reaction were then carried out under such conditions that the mixture was allowed to reside at 260° C. for 15 minutes, followed by pelletizing.

The resulting pellets were dissolved in methyl ethyl ketone, and the solution was then filtered through a membrane filter (pore diameter=1.0 μm). To the filtrate, methanol was poured, and the deposited precipitate was collected by filtration, sufficiently washed with methanol, and then dried under reduced pressure to obtain a white solid. As a result of the analysis of this solid, it was apparent that the solid was a modified polymethacrylic resin to which 4.7 wt % of a 4,6-diamino-1,3,5-triazine skeleton was bonded. The results of the elemental analysis of this solid were as follows.

|  | Elemental analysis | | |
| --- | --- | --- | --- |
|  | C | H | N |
| Found: | 55.4% | 6.9% | 3.0% |

EXAMPLE 10

Preparation of modified EP rubber:

100 parts by weight of an EP rubber (trade name JSR EPO1P, made by Japan Synthetic Rubber Co., Ltd.) and 10 parts by weight of norbornenecarboguanamine were fed to a kneader equipped with a vent sealed with nitrogen, and kneading and reaction were carried out at 240° C. for 30 minutes and a kneaded material was then taken off.

The kneaded material was dissolved in hot xylol, and the solution was then filtered through a membrane filter (pore diameter=1.0 μm). To the filtrate, methyl cellosolve was poured, and the resulting solid was collected by filtration, sufficiently washed with methyl cellosolve, and then dried under reduced pressure to obtain a white solid. As a result of the analysis of this solid, it was apparent that the solid was a modified EP rubber to which 4.4 wt % of a 4,6-diamino-1,3,5-triazine skeleton was bonded. The results of the elemental analysis of this solid were as follows.

|  | Elemental analysis | | |
| --- | --- | --- | --- |
|  | C | H | N |
| Found: | 83.4% | 13.8% | 2.8% |

EXAMPLE 11

Preparation of modified PP wax:

100 parts by weight of a PP wax (trade name Mitsui HIWAX NP055, made by Mitsui Petrochemical Industries, Ltd.) and 20 parts by weight of norbornenecarboguanamine-formaldehyde condensate obtained by a method of Reference Example 1 were fed to a kneader equipped with a vent sealed with nitrogen, and kneading and reaction were carried out at 260° C. for 20 minutes and a kneaded material was then taken off.

The kneaded material was dissolved in hot xylol, and the solution was then filtered through a membrane filter (pore diameter=1.0 μm). To the filtrate, methyl cellosolve was poured, and the resulting resinous material was collected by separation. This treating operation was repeated twice, and the resinous material was then dried under reduced pressure to obtain a white solid. As a result of the analysis of this solid, it was apparent that the solid was a modified PP wax to which 8.8 wt % of a 4,6-diamino-1,3,5-triazine skeleton was bonded. The results of the elemental analysis of this solid were as follows.

|  | Elemental analysis | | |
| --- | --- | --- | --- |
|  | C | H | N |
| Found: | 81.3% | 13.1% | 5.6% |

EXAMPLES 12 TO 16

Preparation of modified polypropylene resin:

Kneading and reaction were carried out by the same procedure as in Example 1 except that norbornenecarboguanamine in Example 1 was replaced with each of norbornenyl group-containing compounds shown in Table 1, followed by pelletizing.

The resulting pellets were treated with a solvent in the same manner as in Example 1. The resulting solid was dried under reduced pressure, and a nitrogen content was then measured (elemental analysis). The results are shown in Table 1.

As shown in Table 1, when the reaction is carried out using the norbornenyl group-containing compounds regarding the present invention, the excellent modified polypropylene resins can be prepared easily in a high yield.

TABLE 1

| Example | Norbornenyl Group-Containing Compound | Elemental Analysis (N %) |
| --- | --- | --- |
| 12 | Etherified Condensate of Reference Example 3 | 2.4 |
| 13 | 2-(4,6-diamino-1,3,5-triazin-2-yl)-2-methyl- | 2.7 |

TABLE 1-continued

| Example | Norbornenyl Group-Containing Compound | Elemental Analysis (N %) |
|---|---|---|
| 14 | 2-[4,6-bis(butoxymethyamino)-1,3,5-triazin-2-yl]-bicyclo[2.2.1]hept-5-ene | 1.6 |
| 15 | 2-[4,6-bis(N,N-di-n-hexyl-amino)-1,3,5-triazin-2-yl]-bicyclo[2.2.1]hept-5-ene | 1.1 |
| 16 | 2-[4,6-bis(2-hydroxyethyl-amino)-1,3,5-triazin-2-yl]-bicyclo[2.2.1]hept-5-ene | 2.1 |

EXAMPLE 17

Preparation of modified polyethylene resin:

100 parts by weight of a polyethylene resin (trade name Rextron J79-4F25, made by Nippon Petrochemicals Co., Ltd.) was sufficiently mixed with 20 parts by weight of enecarboguanamine and 0.1 part by weight of dilauodipropionate by a Henschel mixer. Afterward, the was fed to a twin-screw extruder equipped with a 20-mm vent sealed with nitrogen, and kneading and reaction were then carried out under such conditions that the mixture was allowed to reside at 280° C. for 10 minutes, followed by pelletizing.

The resulting pellets were dissolved in hot xylol, and the solution was then filtered through a membrane filter (pore diameter=1.0 μm). To the filtrate, methyl cellosolve was poured, and the deposited precipitate was collected by filtration, sufficiently washed with methyl cellosolve, and then dried under reduced pressure to obtain a white solid. As a result of the analysis of this solid, it was apparent that the solid was a modified polyethylene resin to which 9.1 wt % of a 4,6-diamino-1,3,5-triazine skeleton was bonded. The results of the elemental analysis of this solid were as follows.

| | Elemental analysis | | |
|---|---|---|---|
| | C | H | N |
| Found: | 80.9% | 13.3% | 5.8% |

EXAMPLE 18

Preparation of modified polyethylene resin:

100 parts by weight of a polyethylene resin (trade name HIZEX 6200BP, made by Mitsui Petrochemical Industries, Ltd.) was sufficiently mixed with 5 parts by weight of a reaction product of 5-norbornene-2-carbonyl chloride and benzyl alcohol (1/1 molar ratio) and 0.1 part by weight of dilauryl thiodipropionate by a Henschel mixer. Afterward, the mixture was fed to a twin-screw extruder equipped with a 20-mm vent sealed with nitrogen, and kneading and reaction were then carried out under such conditions that the mixture was allowed to reside at 260° C. for 10 minutes, followed by pelletizing.

The resulting pellets were dissolved in hot xylol, and the solution was then filtered through a membrane filter (pore diameter=1.0 μm). To the filtrate, m-cresol was poured, and the deposited precipitate was collected by filtration, sufficiently washed with m-cresol, and then dried under reduced pressure to obtain a white solid. As a result of the infrared absorption spectrum analysis of this solid, it was apparent that the solid was a modified polyethylene resin having an ester bond and a phenyl skeleton.

EXAMPLE 19

Preparation of modified polyethylene resin:

100 parts by weight of a polyethylene resin (trade name HIZEX 6200BP, made by Mitsui Petrochemical Industries, Ltd.) was sufficiently mixed with 5 parts by weight of a reaction product of 5-norbornene-2-carbonyl chloride and 4,4'-diamino diphenylether (2/1 molar ratio) and 0.1 part by weight of dilauryl thiodipropionate by a Henschel mixer. Afterward, the mixture was fed to a twin-screw extruder equipped with a 20-mm vent sealed with nitrogen, and kneading and reaction were then carried out under such conditions that the mixture was allowed to reside at 260° C. for 10 minutes, followed by pelletizing.

The resulting pellets were dissolved in hot xylol, and the solution was then filtered through a membrane filter (pore diameter=1.0 μm). To the filtrate, m-cresol was poured, and the deposited precipitate was collected by filtration, sufficiently washed with m-cresol, and then dried under reduced pressure to obtain a white solid. As a result of the infrared absorption spectrum analysis of this solid, it was apparent that the solid was a modified polyethylene resin having an amide bond and a phenyl skeleton.

EXAMPLE 20

Preparation of modified polyethylene resin:

Kneading and reaction were carried out by the same procedure as in Example 19 except that a reaction product of 5-norbornene-2-carbonyl chloride and 4,4'-diamino diphenylether (2/1 molar ratio) was replaced with a reaction product of 2-(bicyclo[2.2.1]hept-5-en-2-yl)-2-oxazoline and benzoic acid (1/1 molar ratio), followed by pelletizing.

The resulting pellets were treated with a solvent in the same manner as in Example 19. As a result of the infrared absorption spectrum analysis of the resulting solid, it was apparent that the solid was a modified polyethylene resin having an amide bond, an ester bond and a phenyl skeleton.

EXAMPLE 21

Preparation of modified paraffin wax:

100 parts by weight of a paraffin wax (trade name Paraffin Wax 155, made by Nippon Seiro Co., Ltd.), 10 parts by weight of norbornenecarboguanamine and 0.1 part by weight of dilauryl thiodipropionate were fed to a 500-ml autoclave equipped with a vent, a stirrer and a cooler. Next, the autoclave was purged with nitrogen, and reaction was then carried out at an inside temperature of 250° C. for 30 minutes under stirring. After the completion of the reaction, the resulting resinous material was taken off as a reaction mixture.

This resinous material was dissolved in hot toluene, and the solution was then filtered through a membrane filter (pore diameter=1.0 μm). To the filtrate, methyl cellosolve was poured, and the resinous material was collected by separation. This treating operation was repeated twice, and the resinous material was then dried under reduced pressure to obtain a white solid. As a result of the analysis of this solid, it was apparent that the solid was a modified paraffin wax to which 4.7 wt % of a 4,6-diamino-1,3,5-triazine skeleton was bonded. The results of the elemental analysis of this solid were as follows.

| Elemental analysis | | | |
|---|---|---|---|
| | C | H | N |
| Found: | 83.2% | 13.8% | 3.0% |

EXAMPLE 22

Preparation of EP-modified polypropylene resin:

100 parts by weight of the pellets of a modified polypropylene resin obtained by the procedure of Example 1 and 20 parts by weight of an epoxy resin (trade name Epicoat #1009, made by Yuka Shell Epoxy Co., Ltd.) were sufficiently mixed by a mixer. Afterward, the mixture was fed to a twin-screw extruder equipped with a 20-mm vent sealed with nitrogen, and kneading and reaction were then carried out under such conditions that the mixture was allowed to reside at 260° C. for 10 minute, followed by pelletizing.

The resulting pellets were dissolved in hot xylol, and the solution was then filtered through a membrane filter (pore diameter=1.0 μm). To the filtrate, methyl cellosolve was poured, and the deposited precipitate was collected by filtration, sufficiently washed with methyl cellosolve, and then dried under reduced pressure to obtain a white solid. As a result of the analysis of this solid, it was apparent that the solid was an EP-modified polypropylene resin having a bisphenol A skeleton. The results of the elemental analysis and infrared absorption spectrum analysis of this solid were as follows.

| Elemental analysis | | | |
|---|---|---|---|
| | C | H | N |
| Found: | 82.2% | 13.0% | 2.7% |

Infrared absorption spectrum analysis
Phenyl ring-based absorption 1603, 1500 cm$^{-1}$

EXAMPLE 23

Preparation of EP-modified EP rubber:

100 parts by weight of a kneaded material of a modified EP rubber obtained by the procedure of Example 10 and 10 parts by weight of an epoxy resin (trade name Epicoat #1004 e by Yuka Shell Epoxy Co., Ltd.) were sufficiently mixed by a mixer. Afterward, the mixture was fed to a kneader type extruder equipped with a 20-mm vent sealed with nitrogen, and kneading and reaction were then carried out under such conditions that the mixture was allowed to reside at 230° C. for 30 minutes. Next, the kneaded material was taken out.

This kneaded material was dissolved in hot xylol, and the solution was then filtered through a membrane filter (pore diameter=1.0 μm). To the filtrate, methyl cellosolve was poured, and the resulting resinous material was collected by separation. This treating operation was repeated twice, and the resinous material was then dried under reduced pressure to obtain a white solid. As a result of the analysis of this solid, it was apparent that the solid was an EP-modified EP rubber having a bisphenol A skeleton. The results of the elemental analysis and infrared absorption spectrum analysis of this solid were as follows.

| Elemental analysis | | | |
|---|---|---|---|
| | C | H | N |
| Found: | 82.8% | 13.3% | 2.6% |

Infrared absorption spectrum analysis
Phenyl ring-based absorption 1603, 1501 cm$^{-1}$

EXAMPLE 24

Preparation of EP-modified PP wax:

100 parts by weight of a kneaded material of a modified PP wax obtained by the procedure of Example 11 and 20 parts by weight of an epoxy resin (trade name Epicoat #1010, made by Yuka Shell Epoxy Co., Ltd.) were sufficiently mixed by a mixer. Afterward, the mixture was fed to a kneader type extruder equipped with a vent sealed with nitrogen, and kneading and reaction were carried out at 230° C. for 20 minutes and the kneaded material was then taken out.

This kneaded material was dissolved in hot xylol, and the solution was then filtered through a membrane filter (pore diameter=1.0 μm). To the filtrate, methyl ethyl ketone was poured, and the resulting resinous material was collected by separation. This treating operation was repeated twice, and the resinous material was then dried under reduced pressure to obtain a white solid. As a result of the analysis of this solid, it was apparent that the solid was an EP-modified PP wax having a bisphenol A skeleton. The results of the elemental analysis and infrared absorption spectrum analysis of this solid were as follows.

| Elemental analysis | | | |
|---|---|---|---|
| | C | H | N |
| Found: | 80.7% | 12.5% | 5.0% |

Infrared absorption spectrum analysis
Phenyl ring-based absorption 1601, 1500 cm$^{-1}$

EXAMPLE 25

Preparation of EP-modified polyethylene resin:

100 parts by weight of the pellets of a modified polyethylene resin obtained by the procedure of Example 4 and 10 parts by weight of p-benzylphenyl glycidyl ether were sufficiently mixed by a mixer. Afterward, the mixture was fed to a twin-screw extruder equipped with a 20-mm vent sealed with nitrogen, and kneading and reaction were then carried out under such conditions that the mixture was allowed to reside at 230° C. for 20 minutes, followed by pelletizing.

The resulting pellets were dissolved in hot xylol, and the solution was then filtered through a membrane filter (pore diameter=1.0 μm). To the filtrate, methyl cellosolve was poured, and the deposited precipitate was collected by filtration, sufficiently washed with methyl cellosolve, and then dried under reduced pressure to obtain a white solid. As a result of the analysis of this solid, it was apparent that the solid was an EP-modified polyethylene resin having a phenyl skeleton. The results of the elemental analysis and infrared absorption spectrum analysis of this solid were as follows.

| Elemental analysis | | |
|---|---|---|
| C | H | N |
| Found: 79.8% | 12.6% | 6.7% |

Infrared absorption spectrum analysis
Phenyl ring-based absorption 1600, 1502 cm$^{-1}$

EXAMPLE 26

Preparation of EP-modified polypropylene resin:

100 parts by weight of the pellets of a modified polypropylene resin obtained by the procedure of Example 1 and 20 parts by weight of the pellets of an epoxidized polyphenyleneether resin obtained by the procedure of Reference Example 4 were sufficiently mixed by a mixer. Afterward, the mixture was fed to a twin-screw extruder equipped with a 20-mm vent sealed with nitrogen, and kneading and reaction were then carried out under such conditions that the mixture was allowed to reside at 280° C. for 10 minutes, followed by pelletizing.

The resulting pellets were dissolved in hot xylol, and the solution was then filtered through a membrane filter (pore diameter=1.0 μm). To the filtrate, chloroform was poured, and the deposited precipitate was collected by filtration, sufficiently washed with chloroform, and then dried under reduced pressure to obtain a solid. Next, this solid was dissolved in hot xylol again, and methyl cellosolve was poured thereto. The deposited precipitate was collected by filtration, followed by the same treatment as described above, to obtain a solid. As a result of the analysis of this solid, it was apparent that the solid was an EP-modified polypropylene resin having a polyphenyleneether resin skeleton. The results of the elemental analysis of this solid were as follows.

| Elemental analysis | | |
|---|---|---|
| C | H | N |
| Found: 82.8% | 13.0% | 2.8% |

EXAMPLE 27

A polypropylene resin composition consisting of 99 parts by weight of a modified polypropylene resin obtained by the procedure of Example 2, 0.6 part by weight of dilauryl thiodipropionate and 0.4 part by weight of pentaerythrityl-tetrakis[3-(3,5-di-t-butyl-4-hydroxyphenyl)propionate] was kneaded at 210° C. for 6 minutes by a mixing roll, and then kneaded and pelletized by an extruder. The resulting pellets were molded by an injection molding machine to prepare test pieces for flammability determination having a thickness of 1/16 inch.

By the use of these test pieces, a test was conducted in accordance with the vertical flammability testing method specified under Subject 94 of Underwriters Laboratories Inc., U.S.A. As a result, the flammability of these test pieces was found to be Level V-1. No melt dripped during combustion and each burnt test piece retained its original shape well. The above-mentioned polypropylene resin composition therefore had excellent flame retardancy.

EXAMPLE 28

In accordance with the same procedure as in Example 27, test pieces were prepared from a polypropylene resin composition consisting of 80 parts by weight of the pellets of a modified polypropylene resin obtained by the procedure of Example 1, 19 parts by weight of ammonium polyphosphate (trade name Exolit 422, made by Hoechst A. G.), 0.6 part by weight of dilauryl thiodipropionate and 0.4 part by weight of pentaerythrityl-tetrakis[3-(3,5-di-t-butyl-4-hydroxyphenyl)propionate].

For these test pieces, a flammability test was conducted by the same procedure as in Example 27. As a result, the flammability of these test pieces was found to be Level V-0 and each burnt test piece retained its original shape well. In addition, it was understood that the simultaneous use of the modified polypropylene resin regarding the present invention and phosphoruses could exert a synergistic effect, whereby the flammability could be further improved. The above-mentioned polypropylene resin composition therefore had excellent flame retardancy.

EXAMPLES 29 TO 32

A polyethylene resin composition consisting of 85 parts by weight of the pellets of a modified polyethylene resin obtained by the procedure of Example 4 and 15 parts by weight of each phosphoruses shown in Table 2 was kneaded at 180° C. for 6 minutes by a mixing roll, and the thus kneaded material was then pelletized by an extruder. In accordance with the same procedure as in Example 27, test pieces for flammability determination were prepared from the obtained pellets, and a test was then conducted. The results are shown in Table 2.

As shown in Table 2, it was understood that the simultaneous use of the modified polyethylene resin regarding the present invention and the phosphoruses could further improve the flammability and was excellent in flame retardancy.

TABLE 2

| | | Flame Retardancy | |
|---|---|---|---|
| Example | Kind of Phosphoruses | Level of UL Standard 94 | Melt Dripping |
| 29 | 2-ethylhexyldiphenyl phosphate | V-0 | None |
| 30 | Tris(tridecyl)-phosphite | V-1 | None |
| 31 | Diethyl N,N-bis(2-hydroxyethyl)amino-methylphosphonate | V-1 | None |
| 32 | Ethylenebistris(2-cyanoethyl)phosphin oxide | V-1 | None |

EXAMPLE 33

The pellets of a modified polyamide resin obtained by the procedure of Example 8 were molded by an injection molding machine to prepare test pieces for flammability determination having a thickness of 1/16 inch.

For these test pieces, a flammability test was conducted by the same procedure as in Example 27. As a result, the flammability of these test pieces was found to be level V-1 and their char formability was excellent, and each burnt test piece retained its original shape well. In consequence, it was apparent that the above-mentioned modified polyamide resin had excellent flame retardancy.

EXAMPLE 34

A polyamide resin composition consisting of 96 parts by weight of the pellets of a modified polyamide resin obtained by the procedure of Example 8 and 4 parts by weight of isocyanuric acid was sufficiently mixed by a mixer, and the mixture was then kneaded and pelletized by an extruder in which a cylinder temperature was set to 260° C. The thus formed pellets were molded by an injection molding machine to prepare test pieces for flammability determination having a thickness of 1/16 inch.

For these test pieces, a flammability test was conducted by the same procedure as in Example 27. As a result, the flammability of these test pieces was found to be Level V-0 and each burnt test piece retained its original shape well. In addition, it was understood that the simultaneous use of the modified polyamide resin regarding the present invention and an isocyanuric acid could exert a synergistic effect, whereby the flammability could be further improved. The above-mentioned polyamide resin composition therefore had excellent flame retardancy.

EXAMPLE 35

A polyester resin composition consisting of 93 parts by weight of the pellets of a modified polyester resin obtained by the procedure of Example 7 and 7 parts by weight of tris(2-hydroxyethyl)isocyanurate was sufficiently mixed by a mixer, and the mixture was then kneaded and pelletized by an extruder in which a cylinder temperature was set to 280° C. The thus formed pellets were molded by an injection molding machine to prepare test pieces for flammability determination having a thickness of 1/16 inch.

For these test pieces, a flammability test was conducted by the same procedure as in Example 27. As a result, the flammability of these test pieces was found to be Level V-0 and each burnt test piece retained its original shape well. In addition, it was understood that the simultaneous use of the modified polyester resin regarding the present invention and an isocyanuric acid could exert a synergistic effect, whereby the flammability could be further improved. The above-mentioned polyester resin composition therefore had excellent flame retardancy.

EXAMPLE 36

30 parts by weight of an EP-modified PP wax obtained by the procedure of Example 24 and 5 parts by weight of cyanuric acid were first mixed by a hot roll. Next, 40 parts by weight of an epoxy resin (trade name Epicoat #828, made by Yuka Shell Epoxy Co., Ltd.) and 25 parts by weight of methylhexahydrophthalic anhydride were added thereto, and they were then mixed by the hot roll to obtain an epoxy resin composition. Afterward, this composition was poured into a casting plate and then cured to prepare test pieces for flammability determination having a thickness of 1/16 inch.

For these test pieces, a flammability test was conducted by the same procedure as in Example 27. As a result, the flammability of these test pieces was found to be Level V-0 and each burnt test piece retained its original shape well.

As shown in Examples 34 to 36, it could been understood that the flame-retarding method of the resins regarding the present invention could provide the excellent flame retardancy in various kinds of resins such as thermoplastic resins and thermosetting resins, and the simultaneous employment of the each modified resin and/or the EP-modified resin regarding the present invention and each of an isocyanuric acid or a cyanuric acid could exert a synergistic effect, whereby the flammability could be further improved.

EXAMPLE 37

A polyphenyleneether resin composition consisting of 45 parts by weight of a modified polyphenyleneether resin obtained by the procedure of Example 5, 30 parts by weight of a modified polystyrene resin obtained by the procedure of Example 6, 10 parts by weight of isocyanuric acid and 15 parts by weight of ammonium polyphosphate (trade name Exolit 422, made by Hoechst A. G.) was mixed by a Henschel mixer, and the mixture was then kneaded and pelletized by an extruder. Next, the thus formed pellets were molded by an injection molding machine to prepare test pieces for flammability determination having a thickness of 1/16 inch.

For these test pieces, a flammability test was conducted by the same procedure as in Example 27. As a result, the flammability of these test pieces was found to be Level V-0 and each burnt test piece retained its original shape well. The above-mentioned polyphenyleneether resin composition therefore had excellent flame retardancy.

EXAMPLE 38

Kneading and reaction were carried out by the same procedure as in Example 5 except that 10 parts by weight of norbornenecarboguanamine in Example 5 was replaced with 20 parts by weight of the same, followed by pelletizing, to obtain a modified polyphenyleneether resin. Furthermore, kneading and reaction were carried out by the same procedure as in Example 6 except that 5 parts by weight of norbornenecarboguanamine in Example 6 was replaced with 15 parts by weight of the same. Next, the reaction product was pelletized to obtain a modified polystyrene resin.

A polystyrene resin composition comprising 20 parts by weight of this modified polyphenyleneether resin, 67 parts by weight of this modified polystyrene resin, 9 parts by weight of triphenyl phosphate and 4 parts by weight of ammonium sulfate was sufficiently mixed by a mixer, and the mixture was then kneaded and pelletized by an extruder in which a cylinder temperature was set to 250° C. The thus formed pellets were molded by an injection molding machine to prepare test pieces for flammability determination having a thickness of 1/16 inch.

For these test pieces, a flammability test was conducted by the same procedure as in Example 27. As a result, the flammability of these test pieces was found to be Level V-0 and each burnt test piece retained its original shape well. The above-mentioned polystyrene resin composition therefore had excellent flame retardancy.

EXAMPLES 39 TO 47

A polypropylene resin composition comprising 78 parts by weight of a modified polypropylene resin obtained by the procedure of Example 1, 18 parts by weight of ammonium polyphosphate (trade name Exolit 422, made by Hoechst A. G.), 3 parts by weight of an amino group-containing compound shown in Table 3, 0.6 part by weight of dilauryl thiodipropionate and 0.4 part by weight of pentaerythrityl-tetrakis[3-(3,5-di-t-butyl-4-hydroxyphenyl)propionate] was treated and tested in the same procedure as in Example 27. The results are shown in Table 3.

As shown in Table 3, it could be understood that according to the flame-retarding method of the resins regarding the present invention, compositions comprising the modified resins regarding the present invention were extremely excellent in self-extinguishing properties, and the burnt test pieces of the compositions could retain their original shape well. Furthermore, the simultaneous employment of each modified resin, at least one of phosphorusus and at least one of amino group-containing compounds could exert the synergistic effect, whereby the flammability could be further improved.

TABLE 3

| Example | Amino group-containing compound | Flame Retardancy Level of UL Standard 94 | Melt Dripping |
|---|---|---|---|
| 39 | N,N-bis(2-amino-ethyl)piperazine | V-0 | None |
| 40 | N-(2-aminoethyly morpholine | V-0 | None |
| 41 | N-(2-aminoethyl) piperidine | V-0 | None |
| 42 | Dicyandiamide | V-0 | None |
| 43 | Guanidine phosphate | V-0 | None |
| 44 | Reaction product of ethylenediamine-formaldehyde (½ molar ratio) | V-0 | None |
| 45 | Reaction product of piperazine-formaldehyde (½ molar ratio) | V-0 | None |
| 46 | Pentamethylenehexamine | V-0 | None |
| 47 | Pentaethylenehexamine | V-0 | None |

EXAMPLE 48

Thermal stability test of modified polyphenyleneether resin:

For a modified polyphenyleneether resin obtained by the procedure of Example 5, thermogravimetric analysis (TG) was made at a temperature rise of 10° C./min in an air atmosphere. As a result, the temperature at a mass reduction ratio of 5 wt % was 434° C.

On the other hand, for a raw material polyphenyleneether resin used in Example 5, the thermogravimetric analysis was made under the same conditions as described above, and as a result, the temperature at a mass reduction ratio of 5 wt % was 401° C.

EXAMPLE 49

Thermal stability test of modified polystyrene resin:

For a modified polystyrene resin obtained by the procedure of Example 6, thermogravimetric: analysis was made under the same conditions as in Example 48. As a result, the temperature at a mass reduction ratio of 5 wt % was 334° C.

On the other hand, for a raw material polystyrene resin used in Example 6, the thermogravimetric analysis was made under the same conditions as described above, and as a result, the temperature at a mass reduction ratio of 5 wt % was 299° C.

EXAMPLE 50

Thermal stability test of modified polymethacrylic resin:

For a modified polymethacrylic resin obtained by the procedure of Example 9, thermogravimetric analysis was made under the same conditions as in Example 48. As a result, the temperature at a mass reduction ratio of 5 wt % was 303° C.

On the other hand, for a raw material polymethacrylic resin used in Example 9, the thermogravimetric analysis was made under the same conditions as described above, and as a result, the temperature at a mass reduction ratio of 5 wt % was 285° C.

EXAMPLE 51

Thermal stability test of modified polypropylene resin:

For a modified polypropylene resin obtained by the procedure of Example 1, thermogravimetric analysis was made under the same conditions as in Example 48. As a result, the temperature at a mass reduction ratio of 5 wt % was 283° C.

On the other hand, for a raw material polypropylene resin used in Example 1, the thermogravimetric analysis was made under the same conditions as described above, and as a result, the temperature at a mass reduction ratio of 5 wt % was 267° C.

EXAMPLE 52

Thermal stability test of modified polyethylene resin:

For a modified polyethylene resin obtained by the procedure of Example 17, thermogravimetric analysis was made under the same conditions as in Example 48. As a result, the temperature at a mass reduction ratio of 5 wt % was 385° C.

On the other hand, for a raw material polyethylene resin used in Example 17, the thermogravimetric analysis was made under the same conditions as described above, and as a result, the temperature at a mass reduction ratio of 5 wt % was 297° C.

As described in Examples 48 to 52, in the modified resins regarding the present invention, the temperature at a mass reduction ratio of 5 wt % could be remarkably heightened, and therefore the thermal stability of the resins could remarkably be improved as compared with the unmodified resin.

EXAMPLE 53

Thermal stability test of modified polyphenyleneether resin:

The pellets of a modified polyphenyleneether resin obtained by the procedure of Example 5 were dissolved in chloroform, and the chloroform solution was then filtered through a membrane filter (pore diameter=1.0 μm) to obtain a chloroform-insoluble solid. Next, this chloroform-insoluble matter was poured into hot methyl cellosolve, and the solution was similarly filtered to obtain an insoluble solid. Afterward, this insoluble solid was dried under reduced pressure, and the weight of the dried solid was then measured. As a result, the content of the insoluble solid was 0.05 wt % based on the weight of the modified polyphenyleneether resin.

Furthermore, an unkneaded raw material polyphenyleneether resin used in Example 5 was treated in the same manner as described above, and as a result, the content of the insoluble solid was 0.03 wt % based on the weight of the resin.

As described above, the insoluble solid content of the modified polyphenyleneether resin regarding the present invention was very low even after kneading and molding under heating at a high temperature and was substantially equal to that of the raw material resin before the kneading. The above-mentioned polyphenyleneether resin therefore was excellent in thermal stability at the kneading and molding/working.

COMPARATIVE EXAMPLE 4

Thermal stability test of polyphenyleneether resin:

Kneading was carried out by the same procedure as in Example 5 except that 10 parts by weight of norbornenecarboguanamine in Example 5 was not used, followed by pelletizing.

The pellets were treated in the same manner as in Example 53, and the weight of an insoluble solid was then measured. As a result, the content of the insoluble solid was 4.61% by weight based on the weight of the kneaded resin.

As described above, in the unmodified polyphenyleneether resin, the content of the insoluble solid remarkably increased with molding/working, and therefore the resin was poor in thermal stability and the molding/working and the like were noticeably limited

EXAMPLE 54

Thermal stability test of polyphenyleneether resin:

A polyphenyleneether resin composition comprising a polyphenyleneether resin consisting of 42 parts by weight of poly-2,6-dimethyl-1,4-phenylene ether component in which an intrinsic viscosity $[\eta]$ was 0.58, 52 parts by weight of a modified polystyrene resin obtained by the procedure of Example 6 and 6 parts by weight of a hydrogenated SBS rubber component was mixed by a mixer, and molten, kneaded and then pelletized by a twin-screw extruder in which a cylinder temperature was set to 280° C. Next, the resulting pellets were molded into test pieces for Izod impact strength measurement having a thickness of ⅛ inch by an injection molding machine in which a cylinder temperature was set to 280° C. These test pieces were allowed to stand for 200 hours in a hot air circulating thermostatic chamber set to 130° C. to make an aging test. The Izod impact strength was measured before and after the aging test in accordance with ASTM D256, and the results are shown in Table 4.

COMPARATIVE EXAMPLE 5

A treatment and a test were carried out by the same procedure as in Example 54 except that a modified polystyrene resin obtained by the procedure of Example 6 which was used in Example 54 was replaced with the same polystyrene resin as described above polystyrene resin before modification. The results are shown in Table 4.

TABLE 4

| | Izod Impact Strength (Note 1) (⅛ inch notched) (kg/cm/cm) | |
|---|---|---|
| | Before Aging | After Aging |
| Example 54 | 12.7 | 7.1 (56) |
| Comp. Ex. 5 | 12.6 | 5.2 (41) |

Note 1: Each value in the parenthesis means a retention ratio (%) of the Izod impact strength after the aging to that before the aging.

EXAMPLES 55 TO 56

Thermal stability test of polyphenyleneether resin:

A treatment and a test were carried out by the same procedure as in Example 54 except that the following additive was added to a polyphenyleneether resin composition of Example 54. The results are shown in Table 5.

TABLE 5

| | Additive (⅛ inch notched) | | Izod Impact Strength (kg/cm/cm) | |
|---|---|---|---|---|
| | Kind | Amount (Note 1) | Before Aging | After Aging |
| Ex. 55 | Triethylene-tetramine | 0.2 | 12.8 | 9.2 (72) |
| Ex. 56 | Tris(nonyl-phenyl) phosphite | 0.2 | 12.7 | 7.6 (60) |

Note 1: The amount was wt % based on the polyphenyleneether resin.

EXAMPLE 57

Thermal stability test of polyethylene resin:

A polyethylene resin composition comprising 94 parts by weight of a polyethylene resin (trade name HIZEX 6200BP, made by Mitsui Petrochemical Industries, Ltd.), 1 part by weight of a fine copper powder and 5 parts by weight of a modified polyethylene resin obtained by the procedure of Example 4 was kneaded at 160° C. for 6 minutes by a mixing roll, and then compression-molded at 150° C. under 200 kg/cm² for 5 minutes to obtain a sheet film.

For this sheet film, an accelerated test of heat deterioration was made under an air atmosphere in a hot pack oven set to a temperature of 150° C. A point of time when the color of this test piece changed was regarded as a deterioration starting point, and on the basis of a time until this deterioration starting point, the thermal stability of the resin composition was judged. The results are shown in Table 6.

Furthermore, a treatment and a test were carried out by the same procedure as described above except that 5 parts by weight of the modified polyethylene obtained by the procedure of Example 4 was not added to the above-mentioned polyethylene resin composition, and the results are shown as "Comparative Example 6" in Table 6.

TABLE 6

| | Period (days) till Start of Deterioration |
|---|---|
| Example 57 | 20 days or more |
| Comp. Ex. 6 | 1 day |

EXAMPLE 58

Thermal stability test of polypropylene resin:

A polypropylene resin composition comprising 94 parts by weight of a polypropylene resin (trade name MITSUI NOBLEN JS-G, made by Mitsui Toatsu Chemicals, Inc.), 1 part by weight of a fine copper powder and 5 parts by weight of a modified polypropylene resin obtained by the procedure of Example 1 was kneaded at 210° C. for 6 minutes by a mixing roll, and then compression-molded at 190° C. under 200 kg/cm² for 5 minutes to obtain a sheet film.

For this sheet film, a treatment and a test were carried out by the same procedure as in Example 57, and the results are shown in Table 7.

Furthermore, a treatment and a test were carried out by the same procedure as described above except that 5 parts by weight of the modified polypropylene resin obtained by the procedure of Example 1 was not added to the above-mentioned polypropylene resin composition, and the results are shown as "Comparative Example 7" in Table 7.

TABLE 7

|  | Period (days) till Start of Deterioration |
| --- | --- |
| Example 58 | 20 days or more |
| Comp. Ex. 7 | 1 day |

EXAMPLE 59

Compatibilization test of binary resin composed of polyphenyleneether resin and polyamideimide resin:

80 parts by weight of modified polyphenyleneether resin pellets obtained by the procedure of Example 5 and 20 parts by weight of a polyamideimide resin (trade name TORON 4203T, made of Amoko Co., Ltd.) were mixed by a Henschel mixer, and the mixture was molten, kneaded and then pelletized by a twin-screw extruder in which a cylinder temperature was set to 330° C.

The thus obtained binary resin composition was observed by an electron microscope, and as a result, a resin melt had a sea-and-island structure in which spheres having a controlled diameter of about 2.7 μm were uniformly dispersed. Thus, the binary resin composition was excellent in compatibility.

EXAMPLE 60

Compatibilization test of binary resin composed of polyphenyleneether resin and EP rubber:

70 parts by weight of modified polyphenyleneether resin pellets obtained by the procedure of Example 5 and 30 parts by weight of a modified EP rubber obtained by the procedure of Example 10 were mixed by a Henschel mixer, and the mixture was molten, kneaded and then pelletized by a twin-screw extruder in which a cylinder temperature was set to 330° C.

The thus obtained binary resin composition was observed by an electron microscope, and as a result, a resin melt had a sea-and-island structure in which spheres having a controlled diameter of about 1.6 μm were uniformly dispersed. Thus, the binary resin composition was excellent in compatibility.

EXAMPLE 61

Compatibilization test of tertiary resin composed of polyamide resin, polyphenyleneether resin and polystyrene resin:

A resin composition comprising 45 parts by weight of modified polyphenyleneether resin pellets obtained by the procedure of Example 5, 50 parts by weight of a polystyrene resin and 5 parts by weight of a hydrogenated SBS rubber was mixed by a Henschel mixer, and the mixture was molten, kneaded and then pelletized by a twin-screw extruder in which a cylinder temperature was set to 300° C. After 50 parts by weight of the pellets was finely ground, 50 parts by weight of a modified polyamide resin obtained by the procedure of Example 8 was added to the finely ground pellets, and this resin composition was then mixed by the Henschel mixer. Next, the mixture was molten, kneaded and then pelletized by a twin-screw extruder in which a cylinder temperature was set to 280° C.

The thus obtained tertiary resin composition was observed by an electron microscope, and as a result, a resin melt had a sea-and-island structure in which spheres having a controlled diameter of about 1.6 μm were uniformly dispersed. Thus, the tertiary resin composition was excellent in compatibility.

EXAMPLE 62

Compatibilization test of binary resin composed of polyphenyleneether resin and polypropylene resin:

80 parts by weight of poly-2,6-dimethyl-1,4-phenyleneether in which an intrinsic viscosity $|\eta|$ was 0.42 and 20 parts by weight of an EP-modified polypropylene resin obtained by the procedure of Example 26 were mixed by a mixer, and the mixture was molten, kneaded and then pelletized by a twin-screw extruder in which a cylinder temperature was set to 330° C.

The thus obtained binary resin composition was observed by an electron microscope, and as a result, a resin melt had a sea-and-island structure in which spheres having a controlled diameter of about 1.1 μm were uniformly dispersed. Thus, the binary resin composition was excellent in compatibility.

EXAMPLE 63

Compatibilization test of binary resin composed of saturated polyester resin and polypropylene resin:

80 parts by weight of a saturated polyester resin (Teijin PBT Resin TRB-H, made by Teijin Limited) and 20 parts by weight of a modified polypropylene resin obtained by the procedure of Example 2 were mixed by a Henschel mixer, and the mixture was molten, kneaded and then pelletized by a twin-screw extruder in which a cylinder temperature was set to 260° C.

The thus obtained binary resin composition was observed by an electron microscope, and as a result, a resin melt had a sea-and-island structure in which spheres having a controlled diameter of about 2.3 μm were uniformly dispersed. Thus, the binary resin composition was excellent in compatibility.

EXAMPLE 64

Compatibilization test of binary resin composed of polyamide resin and polypropylene resin:

70 parts by weight of a polyamide resin (Toyobo Nylon T-802, made by Toyobo Co., Ltd.), 30 parts by weight of a polypropylene resin (trade name MITSUI NOBLEN JS-G, made by Mitsui Toatsu Chemicals, Inc.), 3 parts by weight of a reaction product of 5-norbornene-2-carbonyl chloride and hexamethylenediamine (molar ratio=2/1) and 0.1 part by weight of dilauryl thiodipropionate were sufficiently mixed by a Henschel mixer, and the mixture was then fed to a twin-screw extruder equipped with a 20-mm vent sealed with nitrogen. Afterward, kneading and reaction were carried out under such conditions that the mixture was allowed to reside at 250° C. for 20 minutes, followed by pelletizing.

The thus obtained binary resin composition was observed by an electron microscope, and as a result, a resin melt had a sea-and-island structure in which spheres having a controlled diameter of about 0.6 μm were uniformly dispersed. Thus, the binary resin composition was excellent in compatibility.

EXAMPLE 65

Compatibilization test of binary resin composed of polyphenyleneether resin and polyamide resin:

80 parts by weight of poly-2,6-dimethyl-1,4-phenylene ether in which an intrinsic viscosity |η| was 0.42, 20 parts by weight of a polyamide resin (Toyobo Nylon T-802, made by Toyobo Co., Ltd.) and 3 parts by weight of a norbornenecarboguanamine-formaldehyde condensate obtained by the procedure of Reference Example 2 were sufficiently mixed by a Henschel mixer, and the mixture was then fed to a twin-screw extruder equipped with a 20-mm vent sealed with nitrogen. Afterward, kneading and reaction were carried out under such conditions that the mixture was allowed to reside at 280° C. for 20 minutes, followed by pelletizing.

The thus obtained binary resin composition was observed by an electron microscope, and as a result, a resin melt had a sea-and-island structure in which spheres having a controlled diameter of about 0.5 μm were uniformly dispersed. Thus, the binary resin composition was excellent in compatibility.

As described in Examples 59 to 65, it was understood that in the compatibilization method of the resins regarding the present invention, the employment of the modified resins of the present invention could remarkably improve the compatibilization between the different kinds of resins.

EXAMPLE 66

Compatibilization test of binary resin composed of polyamide resin and polypropylene resin:

70 parts by weight of a polyamide resin (Toyobo Nylon T-802, made by Toyobo Co., Ltd.) and 30 parts by weight of EP-modified polypropylene resin pellets obtained by the procedure of Example 22 were mixed by a Henschel mixer, and the mixture was molten, kneaded and then pelletized by a twin-screw extruder in which a cylinder temperature was set to 220° C.

The thus obtained binary resin composition was observed by an electron microscope, and as a result, a resin melt had a sea-and-island structure in which spheres having a controlled diameter of about 1.1 μm were uniformly dispersed. Thus, the binary resin composition was excellent in compatibility.

EXAMPLE 67

Compatibilization test of binary resin composed of polystyrene resin and polyethylene resin:

80 parts by weight of a polystyrene resin (Topolex 570-02, made by Mitsui Toatsu Chemicals, Inc.) and 20 parts by weight of EP-modified polyethylene resin pellets obtained by the procedure of Example 25 were mixed by a Henschel mixer, and the mixture was molten, kneaded and then pelletized by a twin-screw extruder in which a cylinder temperature was set to 230° C.

The thus obtained binary resin composition was observed by an electron microscope, and as a result, a resin melt had a sea-and-island structure in which spheres having a controlled diameter of about 2.7 μm were uniformly dispersed. Thus, the binary resin composition was excellent in compatibility.

As described in Examples 66 and 67, it was understood that in the compatibilization method of the resins regarding the present invention, the employment of the EP modified resins of the present invention could remarkably improve the compatibilization between the different kinds of resins.

COMPARATIVE EXAMPLE 8

A treatment was carried out by the same procedure as in Example 66 except that EP-modified polypropylene resin pellets obtained by the procedure of Example 22 which was used in Example 66 were replaced with a polypropylene resin (trade name MITSUI NOBLEN JS-G, made by Mitsui Toatsu Chemicals, Inc.), thereby obtaining pelletized resin composition.

The thus obtained resin composition was observed by an electron microscope, and as a result, a resin melt had a sea-and-island structure, but in this structure, there were spherical and elliptical particles having uncontrolled diameters in a wide range of from 5 to 100 μm. Thus, this resin composition was extremely poor in compatibility.

EXAMPLE 68

Surface wettability test of modified polypropylene resin:

Polypropylene resin pellets obtained by the procedure of Example 1 were dissolved in hot xylol, and the solution was then filtered through a membrane filter (pore diameter=1.0 μm). To the filtrate, methyl cellosolve was poured, and the deposited precipitate was collected by filtration, sufficiently washed with methyl cellosolve, and then dried under reduced pressure to obtain a white solid. Next, this solid was press-molded at a temperature of 220° C. under a press pressure of 50 kg/cm$^2$ for 5 minutes to obtain a molded plate having a thickness of 1 mm.

A surface wettability test was carried out by the use of this molded plate. That is to say, a wet index standard liquid for a wettability test (made by WAKO Pure Chemical Industries) was applied in a belt form on the molded plate by a cotton swab. As a result, it was apparent that when the standard liquid of 36 dyne/cm (23°±2° C.) was applied thereonto, the original belt form of the liquid was maintained, and in other words, the surface kept wet, even after a certain time had elapsed.

On the other hand, another molded plate was prepared under the same condition as described above from raw material polypropylene resin pellets used in Example 1. By the use of this molded plate, a surface wettability test was carried out in a manner similar to the above, and as a result, it was apparent that when a standard liquid of 32 dyne/cm (23°±2° C.) was applied thereonto, the liquid immediately became the form of a ball, and in other words, the surface did not wet at all.

As described above, the modified polypropylene resin regarding the present invention was much more excellent in surface wettability as compared with the unmodified polypropylene resin.

COMPARATIVE EXAMPLE 9

Surface wettability test of polypropylene resin composition:

100 parts by weight of a polypropylene resin (trade name MITSUI NOBLEN JS-G, made by Mitsui Toatsu Chemicals, Inc.), 10 parts by weight of adipoguanamine and 0.1 part by weight of dilauryl thiodipropionate were sufficiently mixed by a Henschel mixer, and the mixture was then fed to a twin-screw extruder equipped with a 20-mm vent sealed with nitrogen. Afterward, kneading was carried out under such conditions that the mixture was allowed to reside at 230° C. for 10 minutes, followed by pelletizing, to obtain a polypropylene resin composition.

Next, a molded plate was prepared from the pellets in a manner similar to Example 68, and by the use of this molded plate, a surface wettability test was made. As a result, the molded plate did not wet, even when a standard liquid of 32 dyne/cm (23°±2° C.) was applied thereonto. The surface wettability of the pellets was substantially equal to that of an unmodified polypropylene resin, and so the surface wettability was not excellent.

EXAMPLE 69

Coating properties test of modified polypropylene resin composition:

48 parts by weight of a polypropylene resin (trade name MITSUI NOBLEN BJ5H, made by Mitsui Toatsu Chemicals, Inc.), 22 parts by weight of a modified polypropylene resin obtained by the procedure of Example 1, 22 parts by weight of an EP rubber (trade name JSR EP01P, made by Japan Synthetic Rubber Co., Ltd.), 8 parts by weight of a ground EPDM rubber (trade name JSR EP33, made by Japan Synthetic Rubber Co., Ltd.) and 0.05 part by weight of Iruganox 1010 (trade name, made by Ciba-Geigy) were sufficiently mixed by a Henschel mixer, and the mixture was kneaded and then pelletized by a twin-screw extruder in which a cylinder temperature was set to 210° C. The pellets were molded by an injection molding machine to prepare a test plate for coating having a thickness of ⅛ inch. Next, the surface of this test plate was washed and then dried, and then coated with a two-part curing type polyurethane resin comprising 100 parts by weight of Orester Q186 (made by Mitsui Toatsu Chemicals, Inc., nonvolatile content=50%) and 18 parts by weight of Orester NP2000 (made by Mitsui Toatsu Chemicals, Inc., nonvolatile content=75%) so that film thickness might be 15 fm, and the polyurethane resin was then cured at 80° C. for 50 minutes.

In the coating film on the coated test plate, cissing, blister and the like were not observed, and in an adhesion test (a tape peeling test on a grid pattern), the coating film was not peeled at all, and therefore the coating properties of the modified polypropylene resin composition were extremely good.

EXAMPLE 70

Coating properties test of modified polypropylene resin composition:

A test plate was prepared by the same procedure of Example 69 from 48 parts by weight of a polypropylene resin (trade name MITSUI NOBLEN BJ5H, made by Mitsui Toatsu Chemicals, Inc.), 22 parts by weight of a polypropylene resin (trade name MITSUI NOBLEN JS-G, made by Mitsui Toatsu Chemicals, Inc.), 22 parts by weight of a modified EP rubber obtained by the procedure of Example 10, 8 parts by weight of a ground EPDM rubber (trade name JSR EP33, made by Japan Synthetic Rubber Co., Ltd.) and 0.05 part by weight of Iruganox 1010 (trade name, made by Ciba-Geigy), and the test plate was coated.

In the coating film on the coated test plate, cissing, blister and the like were not observed, and in an adhesion test (a tape peeling test on a grid pattern), the coating film was not peeled at all, and therefore the coating properties of the modified polypropylene resin composition were extremely good.

COMPARATIVE EXAMPLE 10

Coating properties test of polypropylene resin composition:

A test plate was prepared by the same procedure as in Example 69 except that 20 parts by weight of a modified polypropylene resin obtained by the procedure of Example 1 which was used in Example 69 was replaced with a polypropylene resin (trade name MITSUI NOBLEN JS-G, made by Mitsui Toatsu Chemicals, Inc.), and this test plate was coated.

In an adhesion test (a tape peeling test on a grid pattern), the coating film on the coated test plate was completely peeled, and therefore the coating properties of the polypropylene resin composition were extremely poor.

As described in Examples 69 and 70, the polypropylene resin compositions comprising the modified resins regarding the present invention were much more excellent in coating properties as compared with the unmodified composition.

EXAMPLE 71

80 parts by weight of an EP-modified polypropylene resin pellets obtained by the procedure of Example 22 and 20 parts by weight of an EP-modified EP rubber obtained by the procedure of Example 23 were sufficiently mixed by a mixer, and the mixture was kneaded and then pelletized by a twin-screw extruder in which a cylinder temperature was set to 240° C. The pellets were molded by an injection molding machine to prepare a test plate for coating having a thickness of ⅛ inch.

This test plate was coated with an urethane coating material (trade name Orester M83-42CX, made by Mitsui Toatsu Chemicals, Inc.) so that film thickness might be 24 μm, and the coating material was then cured at 80° C. for 5 hours.

In the coating film on the coated test plate, cissing, blister and the like were not observed, and in an adhesion test (a tape peeling test on a grid pattern), the coating film was not peeled at all, and therefore the coating properties of the test plate were extremely good.

EXAMPLE 72

80 parts by weight of modified polyethylene resin pellets obtained by the procedure of Example 4 and 20 parts by weight of a modified EP rubber obtained by the procedure of Example 10 were sufficiently mixed by a mixer, and the mixture was kneaded and then pelletized by a twin-screw extruder in which a cylinder temperature was set to 250° C. The pellets were molded by an injection molding machine to prepare a test piece for tensile shear strength measurement having a thickness of ⅛ inch.

Next, the test piece was caused to adhere to an iron metal test piece at 100° C. for 24 hours by the use of an adhesive composition prepared by mixing 50 parts by weight of an epoxy resin (trade name Konishi Bond Quick Mender, made by Konishi Co., Ltd.) and 50 parts by weight of a curing agent to prepare a specimen based upon JIS K 6850.

The tensile shear strength of this specimen was measured in accordance with JIS K 6850, and as a result, it was 41 Kgf/cm$^2$. Thus, the test piece was excellent in adhesive properties.

EXAMPLE 73

EP-modified polypropylene resin pellets obtained by the procedure of Example 22 were molded by an injection molding machine in which a cylinder temperature was set to 240° C. to prepare a test piece for tensile shear strength measurement having a thickness of ⅛ inch.

Next, from this test piece, a specimen was prepared by the same procedure as in Example 72, and the tensile shear strength was then measured. As a result, it was 87 Kgf/cm$^2$, and therefore the specimen was excellent in adhesive properties.

On the other hand, another specimen was prepared by the same procedure as described above except that an original polypropylene resin which did not undergo the above-mentioned modification/EP modification was used, and the tensile shear strength was then measured. As a result, it was 8 Kgf/cm², and therefore the specimen was extremely poor in adhesive properties.

As shown in Examples 69 to 73, it was apparent that according to the surface modification method of the resins regarding the present invention, surface properties such as coating properties and adhesive properties could be improved by the use of the modified/EP-modified resins of the present invention.

EXAMPLE 74

Surface modification test of polypropylene resin:

A molded plate of a modified polypropylene resin obtained by the procedure of Example 68 was coated and reacted with phenyltrichlorosilane as a silane coupling agent at room temperature for 1 hour under a nitrogen atmosphere. Next, the surface of this coated molded plate was washed with toluene, and then dried with hot air.

For this coated molded plate, X-ray emission spectrochemical analysis (ESCA) was carried out, and as a result, it was apparent that the $Si_{2p}/C_{1s}$ spectrum of the surface of the molded plate was remarkably large, which meant that the surface of the molded plate was modified.

EXAMPLE 75

Dyeability test of modified polypropylene resin:

Modified polypropylene resin pellets obtained by the procedure of Example 1 were dissolved in hot xylol, and the solution was then filtered through a membrane filter (pore diameter=1.0 μm). To the filtrate, methyl cellosolve was poured, and the deposited precipitate was collected by filtration, sufficiently washed with methyl cellosolve, and then dried under reduced pressure to obtain a white solid. Next, this solid was spun at a resin temperature of 250° C. for a residence time of 10 minutes at a winding rate of 500 m/min and then stretched to obtain the fiber of the resin.

Next, this fiber was immersed at 90° C. for 60 minutes in a bath ratio of 1:40 in a 5% solution of an acid dye (trade name Amiryl Blue E-PRL, made by Sumitomo Chemical Co., Ltd.) adjusted to pH 5 with 30% acetic acid, thereby dyeing the fiber. The thus dyed fiber was further subjected to a soaping treatment in 2 g/l solution of Emarl Powder 40 (trade name, made by Kao, Ltd.) at 60° C. for 5 minutes in a bath ratio of 1:30, whereby a dyeability test was carried out.

The dyeability of this fiber obtained from the modified polypropylene resin was judged by the naked eye, and as a result, it was apparent that the dyeability was remarkably improved.

COMPARATIVE EXAMPLE 11

Dyeability test of polypropylene resin:

The same procedure as in Example 75 was carried out except that a modified polypropylene resin obtained by the procedure of Example 1 which was used in Example 75 was replaced with a raw material polypropylene resin (trade name MITSUI NOBLEN JS-G, made by Mitsui Toatsu Chemicals, Inc.) used in Example 1, thereby obtaining the fiber of the resin, and the dyeability test of the fiber was then made.

The dyeability of this fiber obtained from the polypropylene resin was judged by the naked eye, and as a result, it was apparent that the dyeability was very poor.

EXAMPLE 76

80 parts by weight of an epoxy group-containing resin (trade name Almatex #7610, made by Mitsui Toatsu Chemicals, Inc.), 12 parts by weight of a modified PP wax obtained by the procedure of Example 11 and 8 parts by weight of 1,4-bis(4,6-diamino-s-triazin-2-yl)cyclohexane were fed to a kneader in which a cylinder temperature was set to 110° C., followed by kneading, to obtain a solid resin. This solid resin was coarsely ground by a coarse grinder, and then finely ground by an atomizer. The resulting powder was sifted through a 150-mesh sieve, and the passed powder was then used for a test as a powdery resin composition for coating. Next, a steel plate chemically treated with zinc phosphate was electrostatically coated so that a film thickness might be about 50 μm, and then subjected to a heat treatment at 210° C. for 30 minutes.

The coating film on the coated steel plate subjected to the heat treatment was excellent in smoothness (judged by the naked eye), and even when the surface of the coating film was rubbed 50 times with a cloth containing n-butanol, the coating film was not peeled. In addition, in an adhesion test (a tape peeling test on a grid pattern), the coating film was not peeled, and therefore the resin composition was excellent in coating properties.

EXAMPLE 77

85 parts by wight of an epoxy resin (trade name Epoky 815, made by Mitsui Toatsu Chemicals, Inc.) and 15 parts by weight of an EP-modified PP wax obtained by the procedure of Example 22 were sufficiently mixed by a mixer to prepare a resin composition for coating. Next, a galvanized sheet steel was coated with this composition, and then heated at 160° C. for 20 minutes to cure the same.

The coating film on the coated steel plate was excellent in smoothness (judged by the naked eye), and even when the surface of the coating film was rubbed 50 times with a cloth containing n-butanol, the coating film was not peeled. In addition, in an adhesion test (a tape peeling test on a grid pattern), the coating film was not peeled, and therefore the resin composition was excellent in coating properties.

As described in Examples 76 and 77, it could be understood that by using the modified resin and the EP-modified resin of the present invention in the resin compositions for coating of the present invention, coating properties such as coating film smoothness, adhesive properties and the like could be improved.

EXAMPLE 78

30 parts by weight of a modified polypropylene resin pellets obtained by the procedure of Example 3, 30 parts by weight of a modified EP rubber obtained by the procedure of Example 10 and 40 parts by weight of a modified PP wax obtained by the procedure of Example 11 were sufficiently mixed by a mixer, and the mixture was then fed to a twin-screw extruder in which a cylinder temperature was set to 200° C., and then kneaded thereby to obtain a resin composition for an adhesive.

This resin composition was applied onto a test plate of a polypropylene resin (trade name MITSUI NOBLEN JS-G, made by Mitsui Toatsu Chemicals, Inc.) having a thickness of ⅛ inch and a metallic test plate made of aluminum by means of a spray gun for a hot melt set to 180° C., thereby preparing a specimen based on JIS K 6850.

The tensile shear strength of this specimen was measured in accordance with JIS K 6850, and as a result, it was 48

Kgf/cm². Thus, the resin composition for an adhesive was excellent in adhesive properties.

EXAMPLE 79

80 parts by weight of an epoxy resin (trade name Epicoat #828, made by Yuka Shell Epoxy Co., Ltd.) and 20 parts by weight of an EP-modified PP wax obtained by the procedure of Example 24 were sufficiently mixed by a mixer, and 30 parts by weight of 4,4'-diaminodiphenylmethane was further added thereto, followed by mixing, to prepare a resin composition for an adhesive.

A test plate of a polypropylene resin (trade name MITSUI NOBLEN JS-G, made by Mitsui Toatsu Chemicals, Inc.) having a thickness of ⅛ inch was caused to adhere to a metallic test plate made of iron via this resin composition at 120° C. for 6 hours, thereby preparing a specimen based on JIS K 6850.

The tensile shear strength of this specimen was measured in accordance with JIS K 6850, and as a result, it was 96 Kgf/cm². Thus, the resin composition for an adhesive was excellent in adhesive properties.

As described in Examples 78 and 79, it could be understood that by using the modified resin and the EP-modified resin of the present invention in the resin compositions for adhesives of the present invention, the adhesive properties between different kinds of materials could be remarkably improved.

What is claimed is:

1. A method for preparing an epoxy-modified resin which comprises the step of reacting at least one selected from the group consisting of epoxides with one of the following:

(i) a modified resin prepared by a process comprising the step of reacting, at a temperature range of from 200° to 450° C., a resin with a compound represented by the formula (2)

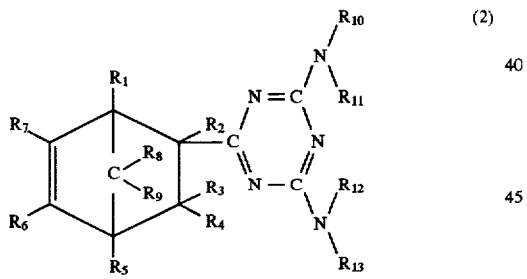

wherein $R_1$, $R_2$, $R_3$, $R_4$, $R_5$, $R_6$, $R_7$, $R_8$, and $R_9$ each is a hydrogen atom, an alkyl group having 1 to 4 carbon atoms or a phenyl group, and they may be the same or different; and $R_{10}$, $R_{11}$, $R_{12}$ and $R_{13}$ each is a hydrogen atom or a group having one or more carbon atoms, and they may be the same or different;

(ii) a modified resin prepared by a process comprising the step of reacting, at a temperature range of from 200° to 450° C., a resin with a condensate having an average addition condensation degree of more than 1 which is obtained by subjecting (a) a compound represented by the formula (2) above, with the proviso that at least one of $R_{10}$, $R_{11}$, $R_{12}$ and $R_{13}$ is a hydrogen atom, (b) a co-condensable compound as an optional reactant and (c) an aldehyde to an addition condensation reaction; or (iii) a modified resin prepared by a process comprising the step of reacting, at a temperature range of from 200° to 450° C., a resin with an etherified condensate having an average addition condensation degree of more than 1 which is obtained by subjecting (a) a compound represented by the formula (2) above, with the proviso that at least one of $R_{10}$, $R_{11}$, $R_{12}$ and $R_{13}$ is a hydrogen atom, (b) a co-condensable compound as an optional reactant and (c) an aldehyde to an addition reaction or an addition condensation reaction, and then subjecting the reaction product and at least one alcohol selected from alcohols having 1–20 carbon atoms to etherification and optionally to simultaneous condensation.

2. The method according to claim 1, wherein the reaction is carried out at a temperature range of from 150° to 400° C.

3. The method according claim 1, wherein the reaction is carried out by reactive processing.

* * * * *

UNITED STATES PATENT AND TRADEMARK OFFICE
CERTIFICATE OF CORRECTION

PATENT NO. : 5,792,814

DATED: : August 11, 1998

INVENTOR(S) : Tetsuya OISHI et al

It is certified that error appears in the above-identified patent and that said Letters Patent is hereby corrected as shown below:

On the title page, Foreign Priority Data should read as follows:

Aug. 16, 1994    Japan    6-192579

Signed and Sealed this

Sixteenth Day of November, 1999

Attest:

Q. TODD DICKINSON

*Attesting Officer*    *Acting Commissioner of Patents and Trademarks*